(12) United States Patent
Ye

(10) Patent No.: US 12,219,335 B2
(45) Date of Patent: Feb. 4, 2025

(54) APPARATUS FOR OUTPUTTING A SOUND

(71) Applicant: LG Display Co., Ltd., Seoul (KR)

(72) Inventor: Jaehun Ye, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 232 days.

(21) Appl. No.: 18/070,103

(22) Filed: Nov. 28, 2022

(65) Prior Publication Data

US 2023/0209268 A1 Jun. 29, 2023

(30) Foreign Application Priority Data

Dec. 28, 2021 (JP) .................................. 2021-214305

(51) Int. Cl.
| H04R 7/04 | (2006.01) |
| G06F 3/01 | (2006.01) |
| H04R 1/28 | (2006.01) |
| H04R 17/00 | (2006.01) |
| H10N 30/20 | (2023.01) |

(52) U.S. Cl.
CPC ............. *H04R 7/045* (2013.01); *G06F 3/016* (2013.01); *H04R 1/2811* (2013.01); *H04R 17/00* (2013.01); *H10N 30/20* (2023.02); *H04R 2400/03* (2013.01); *H04R 2440/05* (2013.01); *H04R 2499/15* (2013.01)

(58) Field of Classification Search
CPC ...... H04R 7/045; H04R 1/2811; H04R 17/00; H04R 2400/03; H04R 2440/05; H04R 2499/15; H04R 17/10; H10N 30/20; G06F 3/016
See application file for complete search history.

(56) References Cited

U.S. PATENT DOCUMENTS

| 3,697,790 | A | * | 10/1972 | Flint ...................... H04R 17/00 310/359 |
| 10,469,928 | B2 | | 11/2019 | Kim et al. |
| 2012/0057728 | A1 | | 3/2012 | Fujise et al. |
| 2019/0028669 | A1 | | 1/2019 | Shin et al. |
| 2021/0176566 | A1 | | 6/2021 | Ye |
| 2021/0392439 | A1 | | 12/2021 | Ye |

FOREIGN PATENT DOCUMENTS

| JP | 2021-90141 A | 6/2021 |
| KR | 2019-0000462 A | 1/2019 |
| KR | 2019-0009188 A | 1/2019 |
| KR | 2019-0052949 A | 5/2019 |
| KR | 2019-0054553 A | 5/2019 |

OTHER PUBLICATIONS

European Search Report of Application No. 22209138.1, dated May 30, 2023, 12 pages.

* cited by examiner

*Primary Examiner* — Mark Fischer
(74) *Attorney, Agent, or Firm* — Morgan, Lewis & Bockius LLP

(57) ABSTRACT

An apparatus may include a passive vibration member, a supporting member overlapping the passive vibration member, and a vibration apparatus between the passive vibration member and the supporting member and configured to include first and second active vibration members connected to each other and intersecting with each other. The first active vibration member may be connected to a first member of one of the passive vibration member and the supporting member, and the second active vibration member may be connected to a second member of the other of the passive vibration member and the supporting member.

20 Claims, 10 Drawing Sheets

APPARATUS FOR OUTPUTTING A SOUND

CROSS-REFERENCE TO RELATED APPLICATIONS

This application claims the benefit of and priority to Japanese Patent Application No. 2021-214305 filed on Dec. 28, 2021, the entirety of which is incorporated herein by reference for all purposes.

BACKGROUND

1. Technical Field

The present disclosure relates to an apparatus and particularly to, for example, without limitation, an apparatus for outputting a sound.

2. Discussion of the Related Art

A separate speaker or a sound apparatus may be used to provide a sound. The sound apparatus may include a vibration system which converts an input electrical signal into a physical vibration. Piezoelectric speakers including ferroelectric ceramic or the like are lightweight and have low power consumption, and thus, may be used for various purposes.

In piezoelectric devices used for piezoelectric speakers, a lowest resonance frequency increases due to high stiffness, and as a result, a sound pressure level of a low-pitched sound band is typically insufficient. Therefore, piezoelectric speakers have a technical problem where a sound pressure level of the low-pitched sound band is not sufficient, and consequently, apparatuses including a piezoelectric speaker have a technical problem where a sound pressure level of the low-pitched sound band is not sufficient.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

The inventor of the present disclosure has recognized the problems and disadvantages of the related art, has performed extensive research and experiments, and has invented an apparatus including a new vibration apparatus, which may enhance a sound pressure level of the low-pitched sound band.

One or more aspects of the present disclosure are directed to providing an apparatus for outputting a sound where a sound pressure level of a low-pitched sound band is enhanced.

One or more other aspects of the present disclosure are directed to providing a sound apparatus and an apparatus including the same, which may enhance a sound pressure level of a low-pitched sound band.

One or more other aspects of the present disclosure are directed to providing a vibration apparatus and an apparatus including the same, which may output a sound having an enhanced sound pressure level of a low-pitched sound band based on a vibration of a flexible vibration member.

Accordingly, embodiments of the present disclosure are directed to an apparatus that substantially obviates one or more of the problems due to limitations and disadvantages of the related art.

Additional features, advantages, and aspects of the present disclosure are set forth in the present disclosure and will also be apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the appended drawings.

To achieve these and other advantages and aspects of the present disclosure, as embodied and broadly described herein, in one or more aspects, an apparatus may comprise a passive vibration member, a supporting member overlapping the passive vibration member, and a vibration apparatus between the passive vibration member and the supporting member and configured to include first and second active vibration members connected to each other and intersecting with each other. The first active vibration member may be connected to a first member of any one of the passive vibration member and the supporting member, and the second active vibration member may be connected to a second member of the other of the passive vibration member and the supporting member.

In one or more aspects of the present disclosure, an apparatus may comprise a passive vibration member, a supporting member overlapping the passive vibration member, and a plurality of vibration apparatuses disposed between the passive vibration member and the supporting member. Each of the plurality of vibration apparatuses may comprise a plurality of active vibration members arranged to intersect with one another at an intersection portion, and a plurality of adhesive members each disposed between two adjacent active vibration members of the plurality of active vibration members at the intersection portion. The plurality of active vibration members may be divided into a first group and a second group each including one or more active vibration members. The one or more active vibration members in the first group may be connected to the supporting member, and the one or more active vibration members in the second group may be connected to the passive vibration member.

According to one or more example embodiments of the present disclosure, an apparatus for outputting a sound having an enhanced sound pressure level of a low-pitched sound band may be provided.

According to one or more example embodiments of the present disclosure, an apparatus for enhancing a sound pressure level of the low-pitched sound band may be provided.

According to one or more example embodiments of the present disclosure, an apparatus for outputting a sound having an enhanced sound pressure level of the low-pitched sound band based on a vibration of a flexible passive vibration member may be provided.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure.

Figure 1:
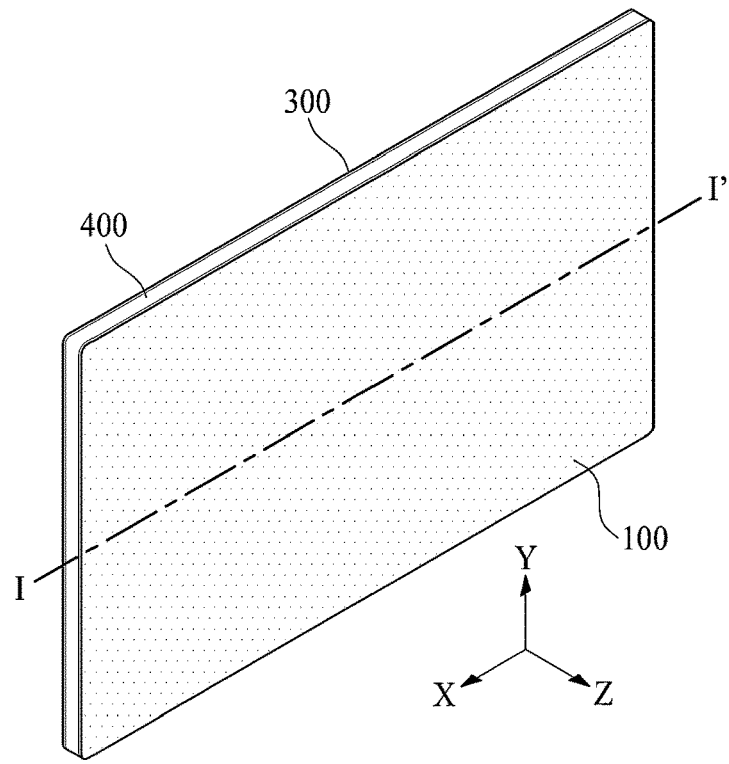
FIG. 1 illustrates an apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

The shapes, sizes, areas, ratios, angles, numbers, and the like disclosed in the drawings for describing embodiments of the present disclosure are merely examples, and thus, the present disclosure is not limited to the illustrated details.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationship, where the positional relationship between two parts is described, for example, using "on," "over," "under," "above," "below," "beneath," "near," "close to," "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element or layer is "connected," "coupled," "attached," or "adhered" to another element or layer, the element or layer can not only be directly connected, coupled, attached, or adhered to another element or layer, but also be indirectly connected, coupled, attached, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise. In one or more aspects, unless stated otherwise, the term "nth" or "$n^{th}$" may refer to "nnd" or "$n^{nd}$" (e.g., 2nd where n is 2), or "nrd" or "$n^{rd}$" (e.g., 3rd where n is 3), and n may be a natural number.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

Figure 2:
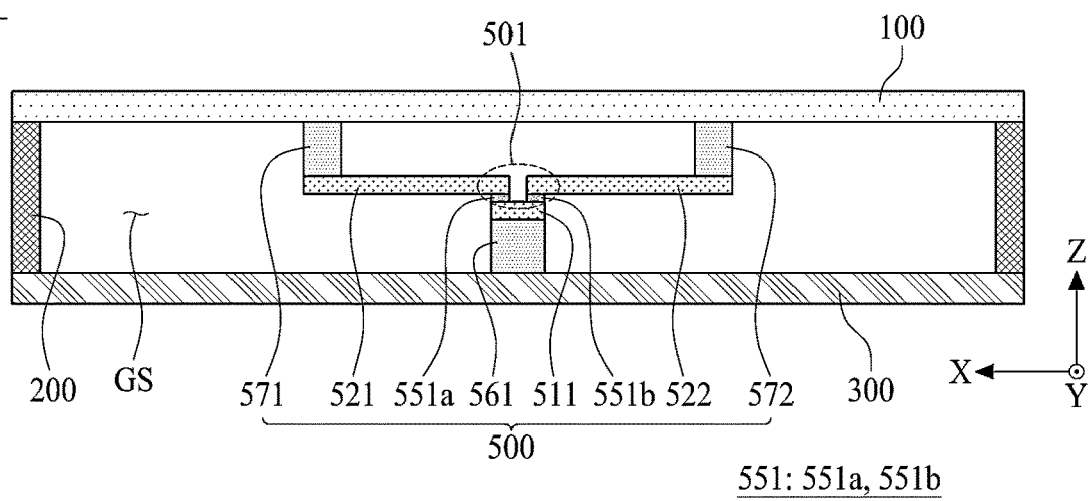
FIG. 2 is an example of a cross-sectional view taken along line I-I' illustrated in FIG. 1.
Figure 3:
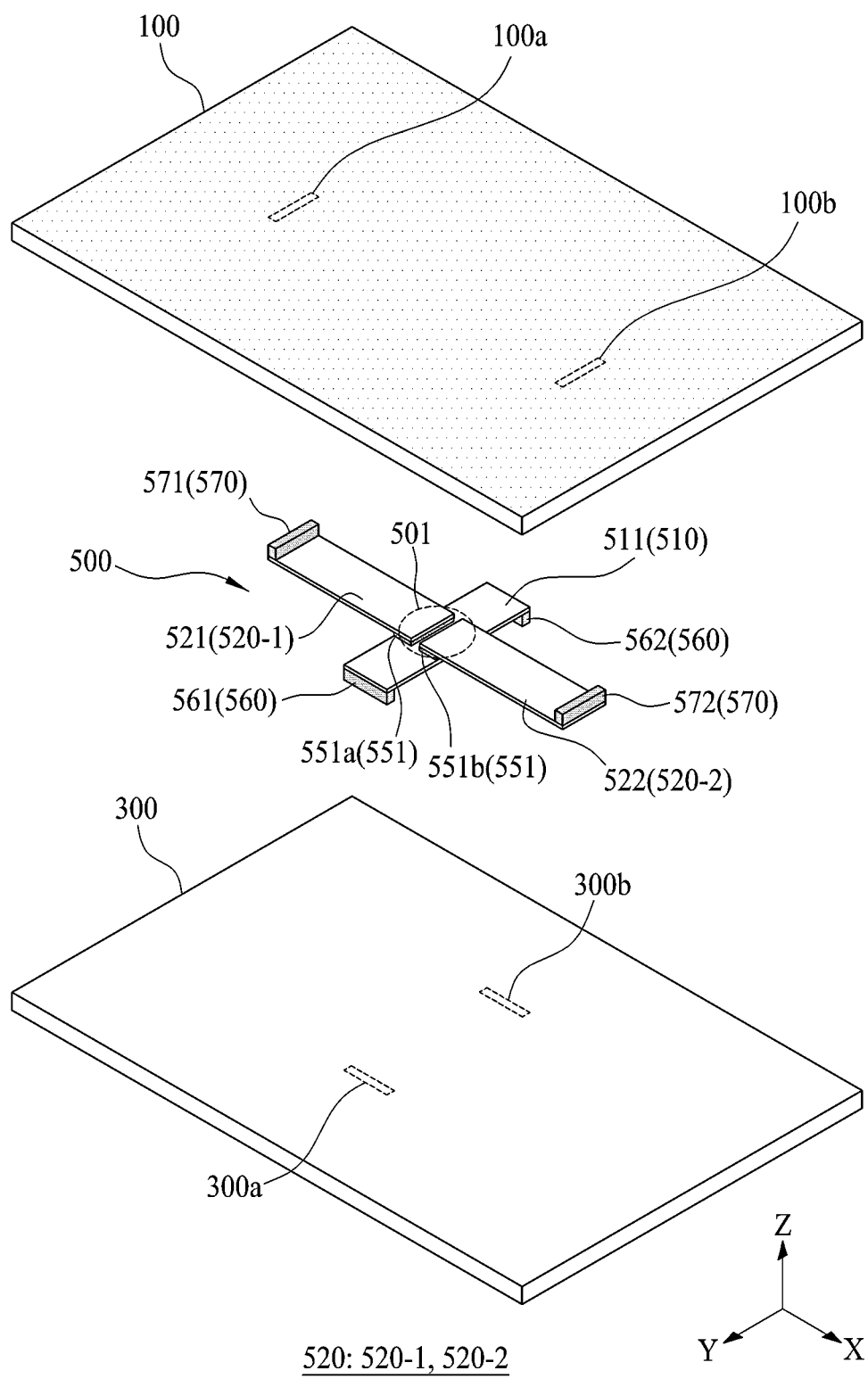
FIG. 3 is an exploded perspective view illustrating the apparatus according to an example embodiment of the present disclosure illustrated in FIG. 1.

FIG. 1 illustrates an apparatus according to an example embodiment of the present disclosure. FIG. 2 is an example of a cross-sectional view taken along line I-I' illustrated in FIG. 1. FIG. 3 is an exploded perspective view illustrating the apparatus according to an example embodiment of the present disclosure illustrated in FIG. 1.

With reference to FIGS. 1 to 3, the apparatus according to an example embodiment of the present disclosure may include a passive vibration member 100, a supporting member 300 which overlaps the passive vibration member 100, and a vibration apparatus 500 which is connected between the passive vibration member 100 and the supporting member 300.

The apparatus according to an example embodiment of the present disclosure may be a flexible display apparatus, a sound generating apparatus, a sound bar, an analog signage, or a digital signage, or the like, but embodiments of the present disclosure are not limited thereto.

The flexible display apparatus may include wearable apparatuses, foldable apparatuses, rollable apparatuses, bendable apparatuses, variable apparatuses, or flexible apparatuses, or the like, but embodiments of the present disclosure are not limited thereto. The analog signage may be an advertising signboard, a poster, a noticeboard, or the like. The analog signage may include signage content such as a sentence, a picture, and a sign, or the like. The signage content may be disposed at the passive vibration member 100 of the apparatus to be visible. For example, the signage content may be directly attached on the passive vibration member 100 and the signage content may be printed on a medium such as paper or the like, and the medium may be attached on the passive vibration member 100.

The passive vibration member 100 may vibrate based on driving (or vibration or displacing) of the vibration apparatuses 500. For example, the passive vibration member 100 may generate one or more of a vibration and a sound based on driving of the vibration apparatuses 500. Accordingly, the passive vibration member 100 may be a vibration object, flexible display panel, a vibration plate, a front cover, a front member, a vibration panel, a sound panel, or a passive vibration panel, but embodiments of the present disclosure are not limited thereto.

The flexible display apparatus may include a flexible display panel including a plurality of pixels for displaying a black/white and/or color image. For example, the flexible display panel may be a flexible organic light emitting display panel, a flexible light emitting diode display panel, a flexible electrophoresis display panel, a flexible electro-wetting display panel, a flexible micro light emitting diode display panel, or a flexible quantum dot light emitting display panel, or the like, but embodiments of the present disclosure are not limited thereto. For example, in the flexible organic light emitting display panel, a pixel may include an organic light emitting device such as an organic light emitting layer or the like, and the pixel may be, or may include, a subpixel which implements any one of a plurality of colors configuring a color image. For example, the passive vibrating member 100 may be a vibration panel of an advertising object or a vibration panel of a signage. For example, the advertising object may be a picture frame, a poster, a standing signboard, and a content of a signage, but embodiments of the present disclosure are not limited thereto.

The passive vibration member 100 may include a material which is relatively lightweight and has flexibility, compared to the supporting member 300. For example, the passive vibration member 100 according to an example embodiment of the present disclosure may include one or more materials of wood, rubber, plastic, flexible glass, fiber, cloth, paper, flexible metal, carbon, a mirror, and leather or a combination thereof, but embodiments of the present disclosure are not limited thereto.

The supporting member 300 may include at least one or more of a glass material, a metal material, and a plastic material. For example, the supporting member 300 may include a stacked structure in which at least one or more of a glass material, a plastic material, and a metal material are stacked thereof. For example, the supporting member 300 may include a material which has a relatively high stiffness or high hardness, compared to the passive vibration member 100. For example, the supporting member 300 may be a rear structure, a supporting structure, a supporting plate, a supporting cover, a rear cover, or a rear member, but embodiments of the present disclosure are not limited thereto.

The supporting member 300 may be disposed to overlap the passive vibration member 100. The supporting member 300 may be disposed under the passive vibration member 100. The supporting member 300 may cover a rear surface of the passive vibration member 100. For example, the supporting member 300 may cover a whole rear surface of the passive vibration member 100 with a gap space GS and the vibration apparatus 500 therebetween. The gap space GS may be provided by the coupling member 200 disposed between the passive vibration member 100 and the supporting member 300 facing each other. The gap space GS may be referred to as an air gap, an accommodating space, a vibration space, or a sound sounding box, but embodiments of the present disclosure are not limited thereto. The supporting member 300 may have the same size as the passive vibration member 100.

Each of the passive vibration member 100 and the supporting member 300 may have a square shape or a rectangular shape, but embodiments of the present disclosure are not limited thereto, and may have a polygonal shape, a non-polygonal shape, a circular shape, or an oval shape. For example, when the apparatus according to another embodiment of the present disclosure is applied to a sound apparatus or a sound bar, each of the passive vibration member 100 and the supporting member 300 may have a rectangular shape where a length of a long side is twice or more times longer than a short side, but embodiments of the present disclosure are not limited thereto.

The coupling member 200 may be configured to be connected between a rear periphery portion of the passive vibration member 100 and a front periphery portion of the supporting member 300, and thus, the gap space GS may be provided between the passive vibration member 100 and the supporting member 300 facing each other. The coupling member 200 according to an example embodiment of the present disclosure may include a material which has adhesive properties and is capable of compression and decompression. For example, the coupling member 200 may include a double-sided tape, a single-sided tape, a double-sided foam tape, or a double-sided adhesive foam pad, but embodiments of the present disclosure are not limited thereto, and may be configured as a material (or an elastic material) which has adhesive properties and is capable of compression and decompression. For example, the coupling member 200 may include an elastic pad such as a rubber pad or a silicone pad, or the like.

The vibration apparatus 500 may be disposed between the passive vibration member 100 and the supporting member 300. The vibration apparatus 500 may be configured to vibrate the passive vibration member 100 based on a composite structure of a 2-degree-of-freedom vibration model. The vibration apparatus 500 may maximize a displacement width (or vibration width) of the passive vibration member 100 based on the composite structure of the 2-degree-of-freedom vibration model, thereby enhancing a sound of a low-pitched sound band generated based on a vibration of the passive vibration member 100.

The vibration apparatus 500 according to an example embodiment of the present disclosure may be configured to include two or a plurality of active vibration members 510 and 520 which are connected to each other. For example, they intersect with each other. For example, the vibration apparatus 500 may be disposed to intersect with each other with respect to an intersection portion 501 and may include the plurality of active vibration members 510 and 520 which are connected to each other at the intersection portion 501. Some (or one or more) of the plurality of active vibration members 510 and 520 may be connected to a first member of any one of the passive vibration member 100 and the supporting member 300, and the other may be connected to a second member of the other one of the passive vibration member 100 and the supporting member 300.

The vibration apparatus 500 according to an example embodiment of the present disclosure may include first and second active vibration members 510 and 520 which are connected to each other. For example, they intersect with each other. For example, the vibration apparatus 500 according to an example embodiment of the present disclosure may be disposed to intersect with each other with respect to the intersection portion 501 and may include the first and second active vibration members 510 and 520 which are connected to each other at the intersection portion 501.

The first active vibration member 510 may be connected to the supporting member (or a first member) 300. The first active vibration member 510 may include one first vibration device 511 connected to the supporting member 300.

The second active vibration member 520 may be connected to the passive vibration member (or a second member) 100. The second active vibration member 520 may be disposed between the passive vibration member 100 and the first active vibration member 510. A portion of the second active vibration member 520 may be connected to the first active vibration member 510 at the intersection portion 501 overlapping the first active vibration member 510.

The second active vibration member 520 may include a 2-$1^{st}$ active vibration member 520-1 and a 2-$2^{nd}$ active vibration member 520-2, which are each connected to the first active vibration member 510 and each connected to the passive vibration member 100. The 2-$1^{st}$ active vibration member 520-1 and the 2-$2^{nd}$ active vibration member 520-2 may be arranged along a direction intersecting with the first active vibration member 510 and may be spaced apart from each other over the first active vibration member 510. For example, the 2-$1^{st}$ active vibration member 520-1 and the 2-$2^{nd}$ active vibration member 520-2 may be a pair of second active vibration members. In one or more aspects of the present disclosure, the 2-$1^{st}$ active vibration member 520-1 and the 2-$2^{nd}$ active vibration member 520-2 may be a second active vibration member and a third active vibration member, but embodiments of the present disclosure are not limited to the notations such as "2-$1^{st}$" and "2-$2^{nd}$". For example, the 2-$1^{st}$ active vibration member 520-1 may be an active vibration member, and the 2-$2^{nd}$ active vibration member 520-2 may be another active vibration member.

The 2-$1^{st}$ active vibration member 520-1 may include a 2-$1^{st}$ vibration device 521, and the 2-$2^{nd}$ active vibration member 520-2 may include a 2-$2^{nd}$ vibration device 522. For example, the 2-$1^{st}$ vibration device 521 and the 2-$2^{nd}$ vibration device 522 may be a pair of second vibration devices. The 2-$1^{st}$ vibration device 521 and the 2-$2^{nd}$ vibration device 522 may be arranged in parallel with each other along a direction intersecting with the first vibration device 511 and may be spaced apart from each other at the intersection portion 501 over the first vibration device 511. In one or more aspects of the present disclosure, the 2-$1^{st}$ vibration device 521 and the 2-$2^{nd}$ vibration device 522 may be a second vibration device (or vibration device) and a third vibration device (or vibration device), but embodiments of the present disclosure are not limited to the notations such as "2-$1^{st}$" and "2-$2^{nd}$". For example, the 2-$1^{st}$ vibration device 521 may be a vibration device, and the 2-$2^{nd}$ vibration device 522 may be another vibration device.

The first vibration device 511, the 2-$1^{st}$ vibration device 521, and the 2-$2^{nd}$ vibration device 522 may each have a tetragonal shape including a short side and a long side, and for example, may have a rectangular shape. Each of the first vibration device 511, the 2-$1^{st}$ vibration device 521, and the 2-$2^{nd}$ vibration device 522 may have the same length, but embodiments of the present disclosure are not limited thereto. For example, each of the first vibration device 511, the 2-$1^{st}$ vibration device 521, and the 2-$2^{nd}$ vibration device 522 may have the same length within a length which enables an arrangement in a gap space GS.

The first vibration device 511 may be disposed to intersect with each of the 2-$1^{st}$ vibration device 521 and the 2-$2^{nd}$ vibration device 522. For example, the first vibration device 511, the 2-$1^{st}$ vibration device 521, and the 2-$2^{nd}$ vibration device 522 may be two-dimensionally arranged at a 90-degree interval with respect to the intersection portion 501, but embodiments of the present disclosure are not limited thereto. For example, the first vibration device 511, the 2-$1^{st}$ vibration device 521, and the 2-$2^{nd}$ vibration device 522 may be two-dimensionally arranged in a "+"-shape or a "x"-shape. In such configurations, they are arranged to cross each other.

Each of the first vibration device 511, the 2-$1^{st}$ vibration device 521, and the 2-$2^{nd}$ vibration device 522 may include first and second periphery portions which are parallel with each other with the intersection portion (or center portion) 501 therebetween. A center portion of the first vibration device 511 may overlap the first periphery portion of each of the 2-$1^{st}$ vibration device 521 and the 2-$2^{nd}$ vibration device 522. Accordingly, the center portion of the first vibration device 511 may not overlap a center portion of each of the 2-$1^{st}$ vibration device 521 and the 2-$2^{nd}$ vibration device 522 and may be disposed between the center portions of the 2-$1^{st}$ vibration device 521 and the 2-$2^{nd}$ vibration device 522.

Each of the first and second periphery portions of the first vibration device 511 may be connected to the supporting member 300. The first periphery portion of each of the 2-$1^{st}$ vibration device 521 and the 2-$2^{nd}$ vibration device 522 may be spaced apart from each other and may be respectively connected to the center portion of the first vibration device 511. The second periphery portion of each of the 2-$1^{st}$ vibration device 521 and the 2-$2^{nd}$ vibration device 522 may be respectively connected to the passive vibration member 100.

Each of the first vibration device 511, the 2-$1^{st}$ vibration device 521, and the 2-$2^{nd}$ vibration device 522 may be a flexural displacement type vibration device (or piezoelectric vibration device). For example, each of the first vibration device 511, the 2-$1^{st}$ vibration device 521, and the 2-$2^{nd}$ vibration device 522 may be a single-layer vibration device (or piezoelectric vibration device) or a stack type vibration device (or piezoelectric vibration device), but embodiments of the present disclosure are not limited thereto.

Each of the first vibration device 511, the 2-$1^{st}$ vibration device 521, and the 2-$2^{nd}$ vibration device 522 may vibrate (or displace or drive) based on a driving signal input thereto.

Each of the first vibration device 511, the 2-$1^{st}$ vibration device 521, and the 2-$2^{nd}$ vibration device 522 may vibrate (or displace or drive) as contraction and expansion are alternately repeated based on a piezoelectric effect (or a piezoelectric characteristic) according to a driving signal applied from the outside. The driving signal may be an alternating current (AC) signal such as a sound signal, a vibration driving signal, or a voice signal, or the like. The 2-$1^{st}$ vibration device 521 and the 2-$2^{nd}$ vibration device 522 may vibrate (or displace or drive) based on the same driving signal. The driving signal applied to the 2-$1^{st}$ vibration device 521 and the 2-$2^{nd}$ vibration device 522 may have the same phase (or in-phase) as a driving signal applied to the first vibration device 511, or may have opposite phases (or anti-phases) with respect to a phase of the driving signal applied to the first vibration device 511.

Each of the first vibration device 511, the 2-$1^{st}$ vibration device 521, and the 2-$2^{nd}$ vibration device 522 may include one or more piezoelectric devices. The one or more piezoelectric devices may include a piezoelectric layer, one or more first electrodes disposed at a first surface of the piezoelectric layer, and one or more second electrodes disposed at a second surface different from the first surface of the piezoelectric layer. For example, the piezoelectric layer may include a front surface and a rear surface. For example, the first surface of the piezoelectric layer may be a first region of the front surface (or the rear surface) of the piezoelectric layer, and the second surface of the piezoelectric layer may be a second region, which is spaced apart from the first region of the front surface (or the rear surface) of the piezoelectric layer. For example, the first surface of the piezoelectric layer may be the front surface of the piezoelectric layer, and the second surface of the piezoelectric layer may be the rear surface of the piezoelectric layer.

In each of the first vibration device 511, the 2-$1^{st}$ vibration device 521, and the 2-$2^{nd}$ vibration device 522, the piezoelectric device may include a piezoelectric layer. In one or more examples, the piezoelectric layer may include a piezoelectric material of a ceramic-based material capable of implementing a relatively high vibration, or may include a piezoelectric ceramic material having a perovskite-based crystal structure. For example, the piezoelectric layer may be configured as a piezoelectric material including lead (Pb) or a piezoelectric material not including lead (Pb). For example, the piezoelectric material including lead (Pb) may include one or more of a lead zirconate titanate (PZT)-based material, a lead zirconate nickel niobate (PZNN)-based material, a lead magnesium niobate (PMN)-based material, a lead nickel niobate (PNN)-based material, a lead zirconate niobate (PZN)-based material, or a lead indium niobate (PIN)-based material, but embodiments of the present disclosure are not limited thereto. For example, the piezoelectric material not including lead (Pb) may include one or more of barium titanate ($BaTiO_3$), calcium titanate ($CaTiO_3$), and strontium titanate ($SrTiO_3$), but embodiments of the present disclosure are not limited thereto. The material of the piezoelectric layer is not limited to the examples described herein.

The vibration apparatus according to an example embodiment of the present disclosure may further include one or more adhesive members 551 and a plurality of elastic members 560 and 570. For example, the vibration apparatus according to an example embodiment of the present disclosure may further include an adhesive member 551, a first elastic member 560, and a second elastic member 570.

The adhesive member 551 may be disposed between the plurality of active vibration members 510 and 520. For example, the adhesive member 551 may be disposed between the first active vibration member 510 and the second active vibration member 520. For example, the adhesive member 551 may be disposed between the first active vibration member 510 and each of the 2-$1^{st}$ active vibration member 520-1 and the 2-$2^{nd}$ active vibration member 520-2. For example, the adhesive member 551 may be disposed between a pair of second active vibration members 521 and 522 and the first active vibration member 510. Accordingly, each of the 2-$1^{st}$ active vibration member 520-1 and the 2-$2^{nd}$ active vibration member 520-2 may be connected to the first active vibration member 510 by the adhesive member 551, and thus, may receive a vibration (or displacement) of the first active vibration member 510 to vibrate (or displace or drive).

The adhesive member 551 may be disposed between the first vibration device 511 of the first active vibration member 510 and each of the 2-$1^{st}$ vibration device 521 of the 2-$1^{st}$ active vibration member 520-1 and the 2-$2^{nd}$ vibration device 522 of the 2-$2^{nd}$ active vibration member 520-2. For example, the adhesive member 551 may be disposed between a pair of second vibration devices 521 and 522 and the first vibration device 511. Accordingly, each of the 2-$1^{st}$ vibration device 521 and the 2-$2^{nd}$ vibration device 522 may be connected to the first vibration device 511 by the adhesive member 551, and thus, may receive a vibration (or displacement) of the first vibration device 511 to vibrate (or displace or drive).

The adhesive member 551 according to an example embodiment of the present disclosure may include a 1-$1^{st}$ adhesive member 551a and a 1-$2^{nd}$ adhesive member 551b. For example, the adhesive member 551 may be an adhesive portion, a first adhesive portion, or a first adhesive member. For example, the 1-$1^{st}$ adhesive member 551a and the 1-$2^{nd}$ adhesive member 551b may be a pair of adhesive members or a pair of first adhesive members. In one or more aspects of the present disclosure, the 1-$1^{st}$ adhesive member 551a and the 1-$2^{nd}$ adhesive member 551b may be a first adhesive member and a second adhesive member, but embodiments of the present disclosure are not limited to the notations such as "1-$1^{st}$" and "1-$2^{nd}$".

The 1-$1^{st}$ adhesive member (or 1-$1^{st}$ adhesive portion) 551a may be adhered between a first periphery portion of the 2-$1^{st}$ vibration device 521 and the first vibration device 511. The 1-$1^{st}$ adhesive member 551a may be adhered between the first periphery portion of the 2-$1^{st}$ vibration device 521 and a first side (or first portion) of the center portion of the first vibration device 511. Accordingly, the first periphery portion of the 2-$1^{st}$ vibration device 521 may be connected to the center portion of the first vibration device 511 by the 1-$1^{st}$ adhesive member 551a, and thus, may receive a vibration (or displacement) of the first vibration device 511 to vibrate (or displace or drive).

The 1-$2^{nd}$ adhesive member (or 1-$2^{nd}$ adhesive portion) 551b may be adhered between a first periphery portion of the 2-$2^{nd}$ vibration device 522 and the first vibration device 511. The 1-$2^{nd}$ adhesive member 551b may be adhered between a first periphery portion of the 2-$2^{nd}$ vibration device 522 and a second side (or second portion) of the center portion of the first vibration device 511. Accordingly, the first periphery portion of the 2-$2^{nd}$ vibration device 522 may be connected to the center portion of the first vibration device 511 by the 1-$2^{nd}$ adhesive member 551b, and thus, may receive a vibration (or displacement) of the first vibration device 511 to vibrate (or displace or drive). Accordingly, the first periphery portion of each of the 2-$1^{st}$ vibration device 521 and the 2-$2^{nd}$ vibration device 522 may vibrate (or displace or drive) together based on a vibration (or displacement) of the first vibration device 511.

According to another embodiment of the present disclosure, the adhesive member 551 may not be divided into the 1-1$^{st}$ adhesive member 551a and the 1-2$^{nd}$ adhesive member 551b and may be attached at the whole center portion (or the intersection portion 501) of the first vibration device 511. Accordingly, the first periphery portion of the 2-1$^{st}$ vibration device 521 and the first periphery portion of the 2-2$^{nd}$ vibration device 522 may be commonly connected to the adhesive member 551 disposed at the whole (or entire) center portion (or the intersection portion 501) of the first vibration device 511 and may be spaced apart from each other over the adhesive member 551.

The adhesive members 551, 551a, and 551b may be configured as an adhesive material capable of compression and decompression. For example, the adhesive members 551, 551a, and 551b may be configured as an adhesive material which is low in elastic modulus. The adhesive members 551, 551a, and 551b may be configured as an adhesive resin material, an adhesive, or an adhesive tape, or the like. The adhesive resin material may include one of an epoxy-based resin material, an acrylic-based resin material, and a silicone-based resin material, but embodiments of the present disclosure are not limited thereto. For example, the adhesive members 551, 551a, and 551b may include an acrylic-based material having a characteristic which is relatively strong in adhesive force and relatively high in hardness compared to a urethane-based material so that a vibration of the first vibration device 511 is effectively transferred to the first periphery portion of each of the 2-1$^{st}$ vibration device 521 and the 2-2$^{nd}$ vibration device 522.

The first elastic member 560 may be connected between the first active vibration member 510 and the supporting member (or the first member) 300. For example, the first elastic member 560 may be connected between the supporting member 300 and each of the first and second periphery portions of the first active vibration member 510. For example, the first elastic member 560 may be connected between the first vibration device 521 and the supporting member 300. For example, the first elastic member 560 may be connected between the supporting member 300 and each of the first and second periphery portions of the first vibration device 511. For example, a center portion of the supporting member 300 may overlap a region between the first and second periphery portions of the first vibration device 511, or may overlap the center portion of the first vibration device 511.

The first elastic member 560 according to another embodiment of the present disclosure may include a 1-1$^{st}$ elastic member 561 and a 1-2$^{nd}$ elastic member 562. For example, the first elastic member 560 may be a first elastic portion or a first elastic supporting portion. For example, the 1-1$^{st}$ elastic member 561 and the 1-2$^{nd}$ elastic member 562 may be a pair of first elastic portions or a pair of first elastic members. In one or more aspects of the present disclosure, the 1-1$^{st}$ elastic member 561 and the 1-2$^{nd}$ elastic member 562 may be a first elastic member and a second elastic member, but embodiments of the present disclosure are not limited to the notations such as "1-1$^{st}$" and "1-2$^{nd}$". For example, the 1-1$^{st}$ elastic member 561 may be an elastic member, and the 1-2$^{nd}$ elastic member 562 may be another elastic member.

The 1-1$^{st}$ elastic member (or 1-1$^{st}$ elastic portion) 561 may be connected between the first periphery portion of the first vibration device 511 and the supporting member 300. The 1-1$^{st}$ elastic member 561 may include a first surface connected to the first periphery portion of the first vibration device 511 and a second surface which is opposite to the first surface and is connected to a first connection region 300a of the supporting member 300. Accordingly, the 1-1$^{st}$ elastic member 561 may elastically or flexibly support the first periphery portion of the first vibration device 511. For example, the first periphery portion of the first vibration device 511 may be connected to the supporting member 300 by the 1-1$^{st}$ elastic member 561 to enable a vibration (or displacement).

The 1-2$^{nd}$ elastic member (or 1-2$^{nd}$ elastic portion) 562 may be connected between the second periphery portion of the first vibration device 511 and the supporting member 300. The 1-2$^{nd}$ elastic member 562 may include a first surface connected to the second periphery portion of the first vibration device 511 and a second surface which is opposite to the first surface and is connected to a second connection region 300b of the supporting member 300. Accordingly, the 1-2$^{nd}$ elastic member 562 may elastically or flexibly support the second periphery portion of the first vibration device 511. For example, the second periphery portion of the first vibration device 511 may be connected to the supporting member 300 by the 1-2$^{nd}$ elastic member 562 to enable a vibration (or displacement).

The first elastic members 560, 561, and 562 according to an example embodiment of the present disclosure may include an elastic material having elasticity or flexibility. The first elastic members 560, 561, and 562 may be configured as an elastic body having an elastic modulus (or Young's modulus) which is lower than each of the first vibration device 511 and the supporting member 300. For example, the first elastic members 560, 561, and 562 may include a double-sided tape, a single-sided tape, a double-sided foam tape, or a double-sided adhesive foam pad, but embodiments of the present disclosure are not limited thereto, and may include an elastic pad such as a rubber pad or a silicone pad, or the like, which has adhesive properties and is capable of compression and decompression. For example, an adhesive layer of the first elastic members 560, 561, and 562 may include an acrylic-based material having a characteristic which is relatively strong in adhesive force and relatively high in hardness.

The first elastic members 560, 561, and 562 according to an example embodiment of the present disclosure may increase a weight (or mass) of the first vibration device 511, and thus, may act as a mass (or mass body) which decreases a resonance frequency (or natural frequency) of the first vibration device 511. Therefore, the first vibration device 511 may increase in mass of both ends thereof due to the first elastic members 560, 561, and 562 and may increase in elasticity due to a composite action based on an elastic modulus of each of the first elastic members 560, 561, and 562, and thus, a vibration width (or displacement width) may increase. The first vibration device 511 may decrease in resonance frequency (or natural frequency) due to the first elastic members 560, 561, and 562, and thus, may vibrate at a relatively low frequency. For example, the first vibration device 511 may decrease in lowest resonance frequency (or lowest natural frequency) due to a mass (or weight) action of each of the first elastic members 560, 561, and 562, and thus, may have a lowest vibration number (or lowest vibration frequency) of several hertz (Hz) to tens of Hz and a vibration width (or displacement width) may be maximized based on a lowest resonance frequency (or lowest natural frequency).

The second elastic member 570 may be connected between the second active vibration member 520 and the passive vibration member (or the second member) 100. For example, the second elastic member 570 may be connected between the passive vibration member 100 and each of the 2-1$^{st}$ active vibration member 520-1 and the 2-2$^{nd}$ active vibration member 520-2 of the second active vibration member 520. For example, the second elastic member 570 may be connected between the second periphery portions of the pair of second active vibration member 521 and 522 and the passive vibration member 100. Accordingly, the second periphery portion of each of the 2-1$^{st}$ active vibration member 520-1 and the 2-2$^{nd}$ active vibration member 520-2 may be connected to the passive vibration member 100 by the second elastic member 570, thereby vibrating (or displacing) the passive vibration member 100.

The second elastic member 570 may include a 2-1$^{st}$ elastic member 571 and a 2-2$^{nd}$ elastic member 572. For example, the second elastic member 570 may be a second elastic portion or a second elastic supporting portion. For example, the 2-1$^{st}$ elastic member 571 and the 2-2$^{nd}$ elastic member 572 may be a pair of second elastic portions or a pair of second elastic members. In one or more aspects of the present disclosure, the 2-1$^{st}$ elastic member 571 and the 2-2$^{nd}$ elastic member 572 may be a third elastic member and a fourth elastic member, but embodiments of the present disclosure are not limited to the notations such as "2-1$^{st}$" and "2-2$^{nd}$". For example, the 2-1$^{st}$ elastic member 571 may be an additional elastic member, and the 2-2$^{nd}$ elastic member 572 may be another additional elastic member.

The 2-1$^{st}$ elastic member (or 2-1$^{st}$ elastic portion) 571 may be connected between the second periphery portion of the 2-1$^{st}$ vibration device 521 and the passive vibration member 100. The 2-1$^{st}$ elastic member 571 may include a first surface connected to the second periphery portion of the 2-1$^{st}$ vibration device 521 and a second surface which is opposite to the first surface and is connected to a first connection region 100a of the passive vibration member 100. Accordingly, the 2-1$^{st}$ elastic member 571 may elastically or flexibly support the second periphery portion of the 2-1$^{st}$ vibration device 521. For example, the second periphery portion of the 2-1$^{st}$ vibration device 521 may be connected to the passive vibration member 100 by the 2-1$^{st}$ elastic member 571 to enable a vibration (or displacement).

The 2-1$^{st}$ elastic member 571 according to an example embodiment of the present disclosure may include an elastic material having elasticity or flexibility. The 2-1$^{st}$ elastic member 571 may be configured as an elastic body having an elastic modulus (or Young's modulus) which is lower than each of the 2-1$^{st}$ vibration device 521 and the passive vibration member 100. The 2-1$^{st}$ elastic member 571 may be configured as the same elastic material as each of the first elastic members 560, 561, and 562, but embodiments of the present disclosure are not limited thereto, and the 2-1$^{st}$ elastic member 571 may be configured with or as an elastic body having an elastic modulus (or Young's modulus) which is lower than the first elastic members 560, 561, and 562. For example, an adhesive layer of the 2-1$^{st}$ elastic member 571 may include an acrylic-based material having a characteristic which is relatively strong in adhesive force and relatively high in hardness, but embodiments of the present disclosure are not limited thereto.

According to an example embodiment of the present disclosure, the 2-1$^{st}$ elastic member 571 may increase a weight (or mass) of the 2-1$^{st}$ vibration device 521, and thus, may act as a mass (or mass body) which decreases a resonance frequency (or natural frequency) of the 2-1$^{st}$ vibration device 521. Therefore, the 2-1$^{st}$ vibration device 521 may increase in mass of both ends (or both sides) thereof due to the 2-1$^{st}$ elastic member 571 and the first vibration device 511 and may increase in elasticity due to a composite action based on an elastic modulus of each of the 2-1$^{st}$ elastic member 571 and the first elastic member 561, and thus, a vibration width (or displacement width) may increase. The 2-1$^{st}$ vibration device 521 may decrease in resonance frequency (or natural frequency) due to the 2-1$^{st}$ elastic member 571 and the first vibration device 511, and thus, may vibrate at a relatively low frequency. For example, the 2-1$^{st}$ vibration device 521 may decrease in lowest resonance frequency (or lowest natural frequency) due to a mass (or weight) action of the first vibration device 511, and thus, may have a lowest vibration number (or lowest vibration frequency) of several Hz to tens of Hz and a vibration width (or displacement width) may be maximized based on a lowest resonance frequency (or lowest natural frequency).

The 2-2$^{nd}$ elastic member (or 2-2$^{nd}$ elastic portion) 572 may be connected between the second periphery portion of the 2-2$^{nd}$ vibration device 522 and the passive vibration member 100. The 2-2$^{nd}$ elastic member 572 may include a first surface connected to the second periphery portion of the 2-2$^{nd}$ vibration device 522 and a second surface which is opposite to the first surface and is connected to a second connection region 100b of the passive vibration member 100. Accordingly, the 2-2$^{nd}$ elastic member 572 may elastically or flexibly support the second periphery portion of the 2-2$^{nd}$ vibration device 522. For example, the second periphery portion of the 2-2$^{nd}$ vibration device 522 may be connected to the passive vibration member 100 by the 2-2$^{nd}$ elastic member 572 to enable a vibration (or displacement).

The 2-2$^{nd}$ elastic member 572 according to an example embodiment of the present disclosure may be configured with or as an elastic body which is substantially the same as the 2-1$^{st}$ elastic member 571, and thus, the repetitive description thereof may be omitted. According to an example embodiment of the present disclosure, the 2-2$^{nd}$ elastic member 572 may increase a weight (or mass) of the 2-2$^{nd}$ vibration device 522, and thus, may act as a mass (or mass body) which decreases a resonance frequency (or natural frequency) of the 2-2$^{nd}$ vibration device 522. This may be substantially the same as the 2-1$^{st}$ elastic member 571, and thus, the repetitive description thereof may be omitted. Accordingly, the 2-2$^{nd}$ vibration device 522 may decrease in lowest resonance frequency (or lowest natural frequency) due to a mass (or weight) action of the 2-2$^{nd}$ elastic member 572 and the first vibration device 511, and thus, may have a lowest vibration number (or lowest vibration frequency) of several Hz to tens of Hz and a vibration width (or displacement width) may be maximized based on a lowest resonance frequency (or lowest natural frequency).

The vibration apparatus 500 according to an example embodiment of the present disclosure may have a vibration width (or displacement width) based on a composite vibration (or combined vibration) of the first active vibration member 510 and the second active vibration member 520, in driving (or vibrating). When a vibration width (or displacement width) increases in driving (or vibrating) of the vibration apparatus 500, a total vibration width (or displacement width) of the vibration apparatus 500 may increase. For example, the vibration apparatus 500 may have a large vibration width (or displacement width) based on a composite vibration (or combined vibration) of the first vibration device 511, the 2-1$^{st}$ vibration device 521, and the 2-2$^{nd}$ vibration device 522 by a resonance phenomenon based on a lowest resonance frequency (or natural frequency) of each of the first vibration device 511, the 2-1$^{st}$ vibration device 521, and the 2-2$^{nd}$ vibration device 522.

According to an example embodiment of the present disclosure, when driving signals respectively applied to the first vibration device 511, the 2-1$^{st}$ vibration device 521, and the 2-2$^{nd}$ vibration device 522 have the same phase, a total vibration width (or displacement width) of the vibration apparatus 500 may be added to a vibration width (or displacement width) of the first vibration device 511 and a vibration width (or displacement width) of the 2-1$^{st}$ vibration device 521 (or the 2-2$^{nd}$ vibration device 522), and thus, may be maximized. For example, a vibration generated in the first vibration device 511 and a vibration generated in each of the 2-1$^{st}$ vibration device 521 and the 2-2$^{nd}$ vibration device 522 may be reinforced with each other, and thus, vibration efficiency (or vibration characteristic) may be enhanced. Accordingly, the vibration apparatus 500 according to an example embodiment of the present disclosure may increase (or amplify) or maximize a vibration width (or displacement width) of the passive vibration member 100 and may vibrate the passive vibration member 100 at a lowest vibration number (or lowest vibration frequency) of several Hz to tens of Hz.

Therefore, the vibration apparatus 500 according to an example embodiment of the present disclosure may enhance a sound characteristic and a sound pressure level characteristic of the low-pitched sound band generated based on a vibration of the passive vibration member 100 and may vibrate the passive vibration member 100 at a lowest vibration number (or lowest vibration frequency) of several Hz to tens of Hz, thereby enhancing a sound characteristic and a sound pressure level characteristic of a super-low-pitched sound band (or an ultra-low-pitched sound band) of 100 Hz or less. For example, the super-low-pitched sound band (or the ultra-low-pitched sound band) may be a pitched sound band which is inaudible (or which users or their ears cannot hear).

Figure 4:
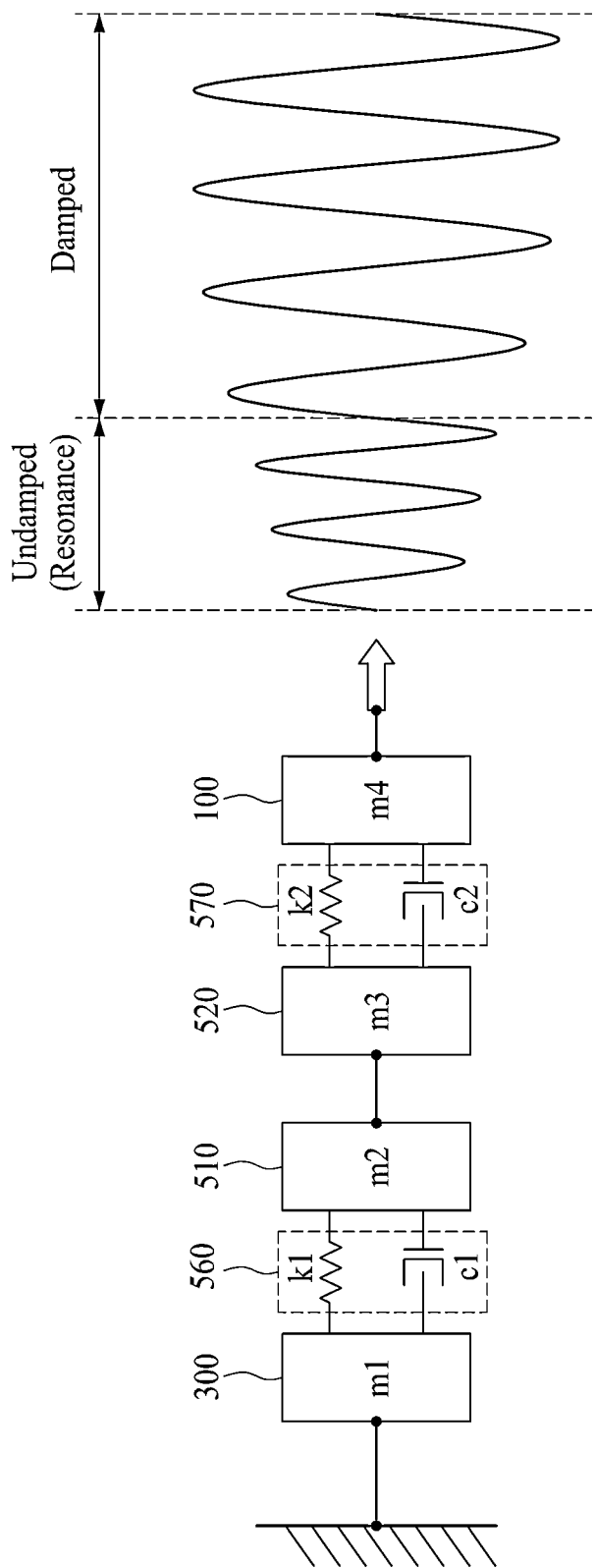
FIG. 4 illustrates a vibration model of an apparatus according to an example embodiment of the present disclosure.

FIG. 4 illustrates a vibration model of an apparatus according to an example embodiment of the present disclosure.

With reference to FIGS. 2 to 4, the apparatus according to an example embodiment of the present disclosure may have the composite structure of the 2-degree-of-freedom vibration model. For example, the apparatus according to an example embodiment of the present disclosure may include a composite model of one undamping model and one damping model.

In the apparatus according to an example embodiment of the present disclosure, a first active vibration member 510 may be connected to a supporting member 300 by a first elastic member 560, the first active vibration member 510 and a second active vibration member 520 may be connected to each other, and the second active vibration member 520 may be connected to a passive vibration member 100 by a second elastic member 570. Therefore, the supporting member 300 may be modeled based on a first mass m1, the first elastic member 560 may be modeled based on a first spring constant k1 and a first damping coefficient c1, the first active vibration member 510 may be modeled based on a second mass m2, the second active vibration member 520 may be modeled based on a third mass m3, the second elastic member 570 may be modeled based on a second spring constant k2 and a second damping coefficient c2, and the passive vibration member 100 may be modeled based on a fourth mass m4. The first active vibration member 510 may be directly connected to the second active vibration member 520, and thus, the second mass m2 and the third mass m3 may be substituted into one composite mass "m2+m3".

The second active vibration member 520 and the passive vibration member 100 may be connected to each other by the second elastic member 570, and thus, may each vibrate (or displace or drive) independently. A force generated based on a vibration of each of the first active vibration member 510 and the second active vibration member 520 may vibrate the passive vibration member 100. The fourth mass m4 of the passive vibration member 100 affected by the force generated based on a vibration of each of the first active vibration member 510 and the second active vibration member 520 may be reduced due to the second elastic member 570, and thus, an acceleration applied to each of the first active vibration member 510, the second active vibration member 520, and the passive vibration member 100 may increase based on the force generated based on a vibration of each of the first active vibration member 510 and the second active vibration member 520, and an acceleration applied to each of the first active vibration member 510 and the second active vibration member 520 may be increased further by the second elastic member 570. Therefore, the first active vibration member 510 and the second active vibration member 520 may resonate at a large displacement. In addition, a displacement (or vibration) of each of the first active vibration member 510 and the second active vibration member 520 may be gradually transferred through the second elastic member 570, and thus, the displacement (or vibration) of each of the first active vibration member 510 and the second active vibration member 520 may not be prevented (or reduced) by the fourth mass m4 of the passive vibration member 100.

Accordingly, the apparatus according to an example embodiment of the present disclosure may increase a displacement amount (or displacement width) of each of the first active vibration member 510, the second active vibration member 520, and the passive vibration member 100, thereby enhancing a sound characteristic and a sound pressure level characteristic of a low-pitched sound band generated based on a vibration of the passive vibration member 100. In addition, the vibration apparatus 500 according to an example embodiment of the present disclosure may vibrate the passive vibration member 100 at a lowest vibration number (or lowest vibration frequency) of several Hz to tens of Hz, thereby enhancing a sound characteristic and a sound pressure level characteristic of a super-low-pitched sound band (or an ultra-low-pitched sound band) of 100 Hz or less. For example, the super-low-pitched sound band (or the ultra-low-pitched sound band) may be a pitched sound band which is inaudible (or which ears of users cannot hear).

Figure 5:
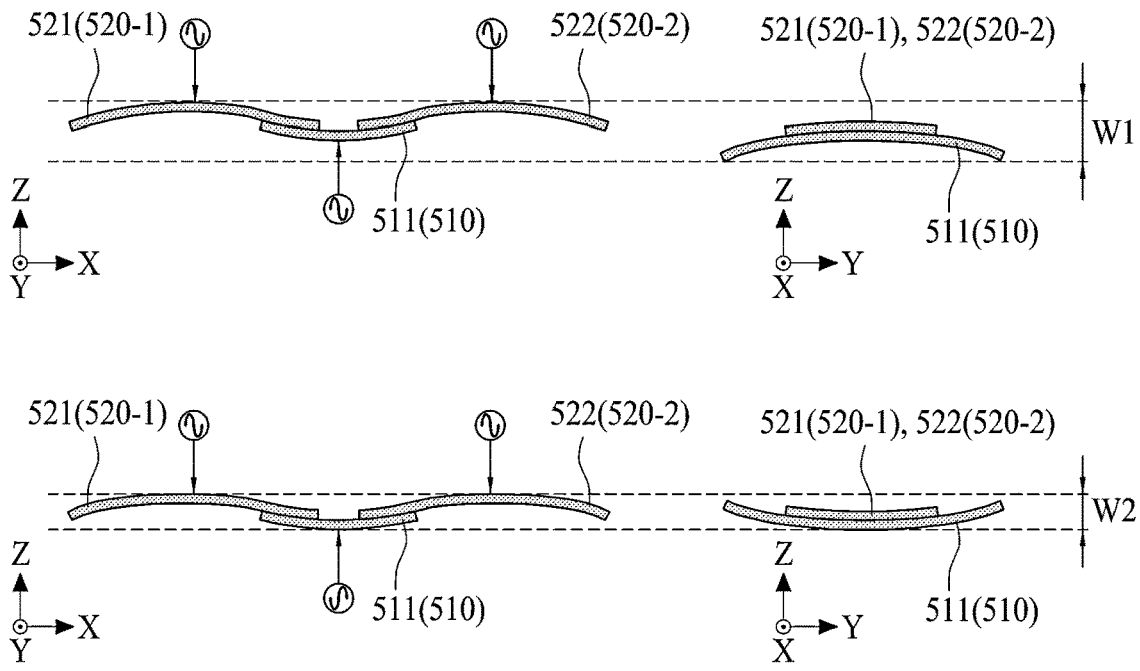
FIG. 5 illustrates an example of a displacement width (or displacement amount) of a vibration apparatus based on a driving signal applied to the first active vibration member and the second active vibration member illustrated in FIGS. 2 and 3.

FIG. 5 illustrates an example of a displacement width (or displacement amount) of a vibration apparatus based on a driving signal applied to the first active vibration member and the second active vibration member illustrated in FIGS. 2 and 3.

With reference to FIGS. 2, 3, and 5, a driving signal (or a first driving signal) applied to the first vibration device 511 of the first active vibration member 510 has the same phase as a driving signal (or a second driving signal) applied to the 2-1$^{st}$ vibration device 521 and the 2-2$^{nd}$ vibration device 522 of the second active vibration member 520, the first vibration device 511, the 2-1$^{st}$ vibration device 521, and the 2-2$^{nd}$ vibration device 522 may be flexed (or displaced or driven or vibrated) in the same shape. For example, the first vibration device 511 may be flexed (or displaced or driven or vibrated) in a first shape based on the first driving signal, and thus, the first and second periphery portions of the first vibration device 511 may be flexed (or displaced or driven or vibrated) in a direction closer to the supporting member 300. Simultaneously, each of the 2-1$^{st}$ vibration device 521 and the 2-2$^{nd}$ vibration device 522 may be flexed (or displaced or driven or vibrated) in the first shape based on the second driving signal having the same phase as the first driving signal, and thus, the second periphery portion of each of the 2-1$^{st}$ vibration device 521 and the 2-2$^{nd}$ vibration device 522 may be flexed (or displaced or driven or vibrated) in a direction closer to the supporting member 300. Accordingly, when driving signals having the same phase are applied to the first active vibration member 510 and the second active vibration member 520, the vibration apparatus 500 may have a first displacement width (or displacement amount) corresponding to a shortest distance between the first and second periphery portions of the first vibration device 511 and a center portion of each of the 2-1$^{st}$ vibration device 521 and the 2-2$^{nd}$ vibration device 522.

When the driving signal (or the first driving signal) applied to the first vibration device 511 of the first active vibration member 510 has an opposite phase of the driving signal (or the second driving signal) applied to each of the 2-1$^{st}$ vibration device 521 and the 2-2$^{nd}$ vibration device 522 of the second active vibration member 520, the first vibration device 511 may be flexed (or displaced or driven or vibrated) in a shape which differs from each of the 2-1$^{st}$ vibration device 521 and the 2-2$^{nd}$ vibration device 522. For example, the first vibration device 511 may be flexed (or displaced or driven or vibrated) in a second shape opposite to the first shape based on the second driving signal having an opposite phase of the first driving signal, and thus, the first and second periphery portions of the first vibration device 511 may be flexed (or displaced or driven or vibrated) in a direction closer to the passive vibration member 100. Simultaneously, each of the 2-1$^{st}$ vibration device 521 and the 2-2$^{nd}$ vibration device 522 may be flexed (or displaced or driven or vibrated) in the first shape based on the second driving signal having the same phase as the first driving signal, and thus, the second periphery portion of each of the 2-1$^{st}$ vibration device 521 and the 2-2$^{nd}$ vibration device 522 may be flexed (or displaced) in a direction closer to the supporting member 300. Therefore, when driving signals having opposite phases are applied to the first active vibration member 510 and the second active vibration member 520, the vibration apparatus 500 may have a second displacement width (or displacement amount) corresponding to a shortest distance between the center portion of the first vibration device 511 and the center portion of each of the 2-1$^{st}$ vibration device 521 and the 2-2$^{nd}$ vibration device 522.

As seen in FIG. 5, when driving signals having the same phase are applied to the first active vibration member 510 and the second active vibration member 520, the vibration apparatus 500 according to an example embodiment of the present disclosure may have a first displacement width W1, and when driving signals having opposite phases are applied to the first active vibration member 510 and the second active vibration member 520, the vibration apparatus 500 may have a second displacement width W2 which is smaller than the first displacement width W1.

Therefore, the apparatus according to an example embodiment of the present disclosure may supply driving signals having the same phase to the first active vibration member 510 and the second active vibration member 520 of the vibration apparatus 500, and thus, may increase a displacement amount (or displacement width) of the passive vibration member 100, thereby enhancing a sound characteristic and a sound pressure level characteristic of a low-pitched sound band (for example, a super-low-pitched sound band (or an ultra-low-pitched sound band) of 100 Hz or less) generated based on a vibration of the passive vibration member 100. In addition, the apparatus according to an example embodiment of the present disclosure may supply driving signals having opposite phases to the first active vibration member 510 and the second active vibration member 520 of the vibration apparatus 500, and thus, may increase a displacement amount (or displacement width) of the passive vibration member 100, thereby enhancing a sound characteristic and a sound pressure level characteristic of a high-pitched sound band generated based on a vibration of the passive vibration member 100.

Figure 6:
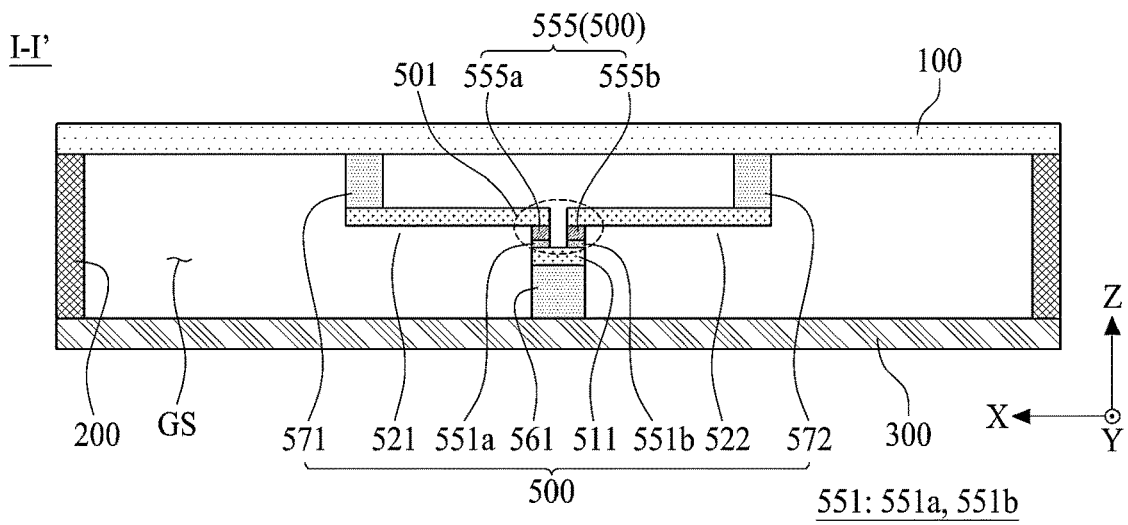
FIG. 6 is an example of another cross-sectional view taken along line I-I' illustrated in FIG. 1.
Figure 7:
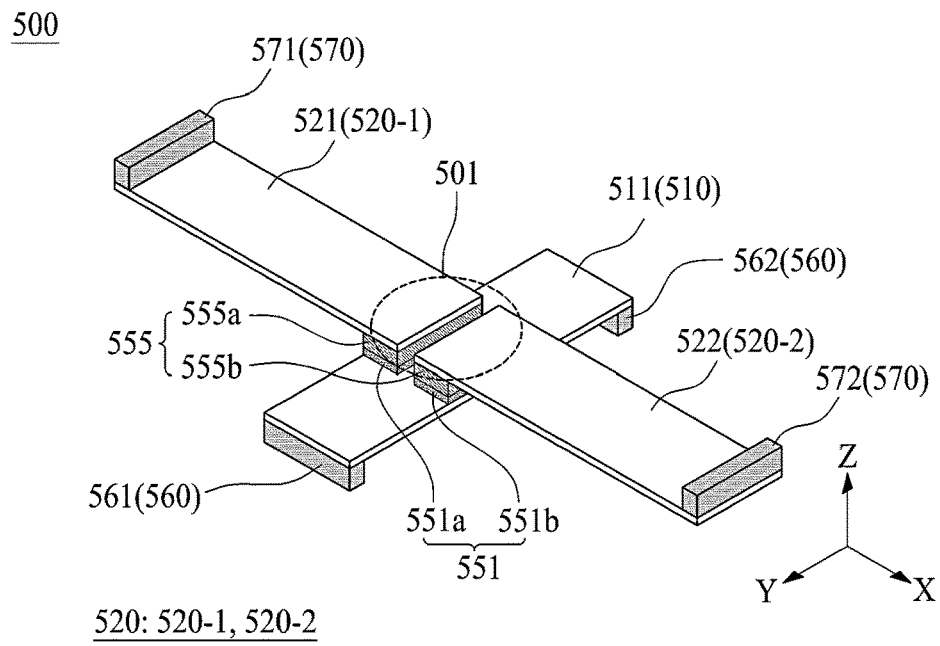
FIG. 7 illustrates a vibration apparatus according to another embodiment of the present disclosure illustrated in FIG. 6.

FIG. 6 is an example of another cross-sectional view taken along line I-I' illustrated in FIG. 1. FIG. 7 illustrates a vibration apparatus according to another embodiment of the present disclosure illustrated in FIG. 6. FIGS. 6 and 7 illustrate an embodiment where a mass member is additionally provided in the apparatus or the vibration apparatus according to an example embodiment of the present disclosure described above with reference to FIGS. 1 to 5. Therefore, in the description of FIGS. 6 and 7, the elements except a mass member and relevant elements may be referred to by like reference numerals, and their repetitive descriptions may be omitted.

With reference to FIGS. 6 and 7, an apparatus or a vibration apparatus 500 according to an example embodiment of the present disclosure may further include a mass member 555.

The mass member 555 may be disposed between a plurality of active vibration members 510 and 520. For example, the mass member 555 may be disposed at an intersection portion 501 between a plurality of active vibration members 510 and 520. For example, the mass member 555 may be disposed between a first active vibration member 510 and a second active vibration member 520. For example, the mass member 555 may be disposed at an intersection portion 501 between the first active vibration member 510 and the second active vibration member 520. For example, the mass member 555 may be disposed between each of a 2-1$^{st}$ active vibration member 520-1 and a 2-2$^{nd}$ active vibration member 520-2 and the first active vibration member 510. For example, the mass member 555 may be disposed between an adhesive member 551 and the first active vibration member 510 or between the adhesive member 551 and the second active vibration member 520. For example, the mass member 555 may be disposed between each of a 2-1$^{st}$ active vibration member 520-1 and a 2-2$^{nd}$ active vibration member 520-2 and the adhesive member 551.

The mass member 555 may be disposed between a first vibration device 511 and each of a 2-1$^{st}$ vibration device 521 and a 2-2$^{nd}$ vibration device 522. For example, the mass member 555 may be disposed between a first vibration device 511 and the adhesive member 551. For example, the mass member 555 may be disposed between each of the 2-1$^{st}$ vibration device 521 and the 2-2$^{nd}$ vibration device 522 and the adhesive member 551. The mass member 555 may be embedded in the adhesive member 551. The adhesive member 551 may be disposed to wholly surround the mass member 555 (or to surround the entire mass member 555).

The mass member 555 may include a 1-1$^{st}$ mass member 555a and a 1-2$^{nd}$ mass member 555b. For example, the mass member 555 may be referred to as a first mass portion, a first mass member, a first mass, or a first weight. For example, the 1-1$^{st}$ mass member 555a and the 1-2$^{nd}$ mass member 555b may be a pair of first mass portions, a pair of first mass members, a pair of first masses, or a pair of first weights. In one or more aspects of the present disclosure, the 1-1$^{st}$ mass member 555a and the 1-2$^{nd}$ mass member 555b may be a first mass member and a second mass member, but embodiments of the present disclosure are not limited to the notations such as "1-1$^{st}$" and "1-2$^{nd}$". For example, the 1-1$^{st}$ mass member 555a may be a first mass member, and the 1-2$^{nd}$ mass member 555b may be a second mass member.

According to an example embodiment of the present disclosure, each of the 1-1$^{st}$ mass member (or a 1-1$^{st}$ mass portion) 555a and the 1-2$^{nd}$ mass member (or a 1-2$^{nd}$ mass portion) 555b may include a first surface and a second surface.

The first surface of the 1-1$^{st}$ mass member 555a may be connected (or adhered) to a 1-1$^{st}$ adhesive member 551a. The first surface of the 1-2$^{nd}$ mass member 555b may be connected (or adhered) to a 1-2$^{nd}$ adhesive member 551b. The second surface of the 1-1$^{st}$ mass member 555a may be connected (or adhered) to a first periphery portion of the first vibration device 511 or the 2-1$^{st}$ vibration device 521. The second surface of the 1-2$^{nd}$ mass member 555b may be connected (or adhered) to a first periphery portion of the first vibration device 511 or the 2-2$^{nd}$ vibration device 522.

According to an example embodiment of the present disclosure, the mass member 555 may not be divided into the 1-1$^{st}$ mass member 555a and the 1-2$^{nd}$ mass member 555b and may be configured as one body (or as one unitary body). For example, the mass member 555 may have a polygonal pillar shape or a circular pillar shape having a size which is smaller than or equal to a center portion (or intersection portion 501) of the first vibration device 511. For example, a first surface of the mass member 555 may be connected (or adhered) to the adhesive member 551. A second surface of the mass member 555 may be connected (or adhered) to the center portion of the first vibration device 511, or may be commonly connected (or adhered) to a first periphery portion of each of the 2-1$^{st}$ vibration device 521 and the 2-2$^{nd}$ vibration device 522.

The mass member 555 or the 1-1$^{st}$ mass member 555a and the 1-2$^{nd}$ mass member 555b may include an elastic material capable of acting as a mass (or mass body) on the vibration devices 511, 521, and 522. For example, the mass member 555 or the 1-1$^{st}$ mass member 555a and the 1-2$^{nd}$ mass member 555b may include an elastic material having strength which is less than a bending strength of each of the vibration devices 511, 521, and 522. For example, the mass member 555 or the 1-1$^{st}$ mass member 555a and the 1-2$^{nd}$ mass member 555b may include the same elastic material as elastic members 560 and 570 or a coupling member 200, but embodiments of the present disclosure are not limited thereto. For example, the mass member 555 or the 1-1$^{st}$ mass member 555a and the 1-2$^{nd}$ mass member 555b may be formed by elastomer, but embodiments of the present disclosure are not limited thereto.

According to another embodiment of the present disclosure, the mass member 555 or the 1-1$^{st}$ mass member 555a and the 1-2$^{nd}$ mass member 555b may include an adhesive layer, or may not include the adhesive layer. For example, when the mass member 555 or the 1-1$^{st}$ mass member 555a and the 1-2$^{nd}$ mass member 555b do not include the adhesive layer, the vibration apparatus 500 according to another embodiment of the present disclosure may further include an adhesive member which is attached on a first surface of the mass member 555.

The mass member 555 or the 1-1$^{st}$ mass member 555a and the 1-2$^{nd}$ mass member 555b may act as a mass (or mass body) which increases a mass (or weight) of each of the first vibration device 511 and the 2-1$^{st}$ and 2-2$^{nd}$ vibration devices 521 and 522 to decrease a lowest resonance frequency (or lowest natural frequency) of each of the vibration devices 511, 521, and 522. Accordingly, each of the first vibration device 511 and the 2-1$^{st}$ and 2-2$^{nd}$ vibration devices 521 and 522 may more decrease a lowest resonance frequency (or lowest natural frequency), and thus, may vibrate at a relatively lower frequency.

As described above, the vibration apparatus 500 according to another embodiment of the present disclosure may further include a mass member 555, and thus, may further enhance a sound characteristic and a sound pressure level characteristic of a super-low-pitched sound band (or an ultra-low-pitched sound band) of 100 Hz or less generated based on a vibration of a passive vibration member 100.

Figure 8:
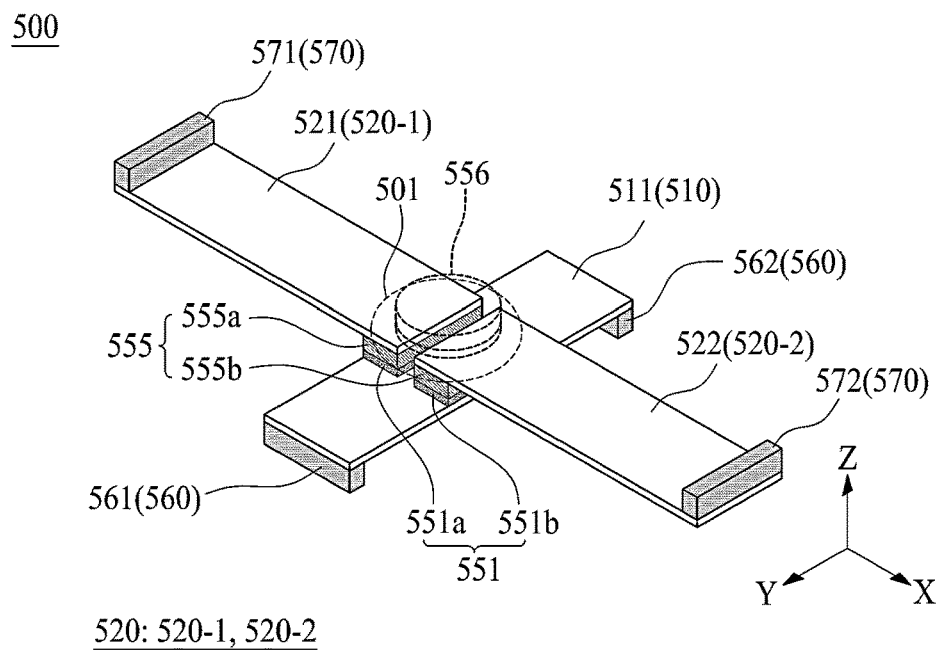
FIG. 8 illustrates a vibration apparatus according to another embodiment of the present disclosure illustrated in FIG. 6.

The apparatus or the vibration apparatus 500 according to another embodiment of the present disclosure, as illustrated in FIG. 8, may further include a secondary mass member 556 for increasing a mass (or weight) of each of the first vibration device 511 and the 2-1$^{st}$ and 2-2$^{nd}$ vibration devices 521 and 522.

The secondary mass member 556 may be connected to a second active vibration member 520, but embodiments of the present disclosure are not limited thereto. For example, the secondary mass member 556 may be connected to a rear center portion of the first vibration device 511. The secondary mass member 556 may include an elastic material which is the same as the mass member 555. For example, the secondary mass member 556 may be configured to have a polygonal pillar shape or a circular pillar shape having a size which is smaller than or equal to a center portion (or intersection portion 501) of the first vibration device 511. Accordingly, the apparatus or the vibration apparatus 500 according to another embodiment of the present disclosure may further include at least one of the mass member 555 and the secondary mass member 556, and thus, may have a larger vibration width (or displacement width) based on a composite vibration (or combined vibration) of a first active vibration member 510 and a second active vibration member 520.

Figure 9:
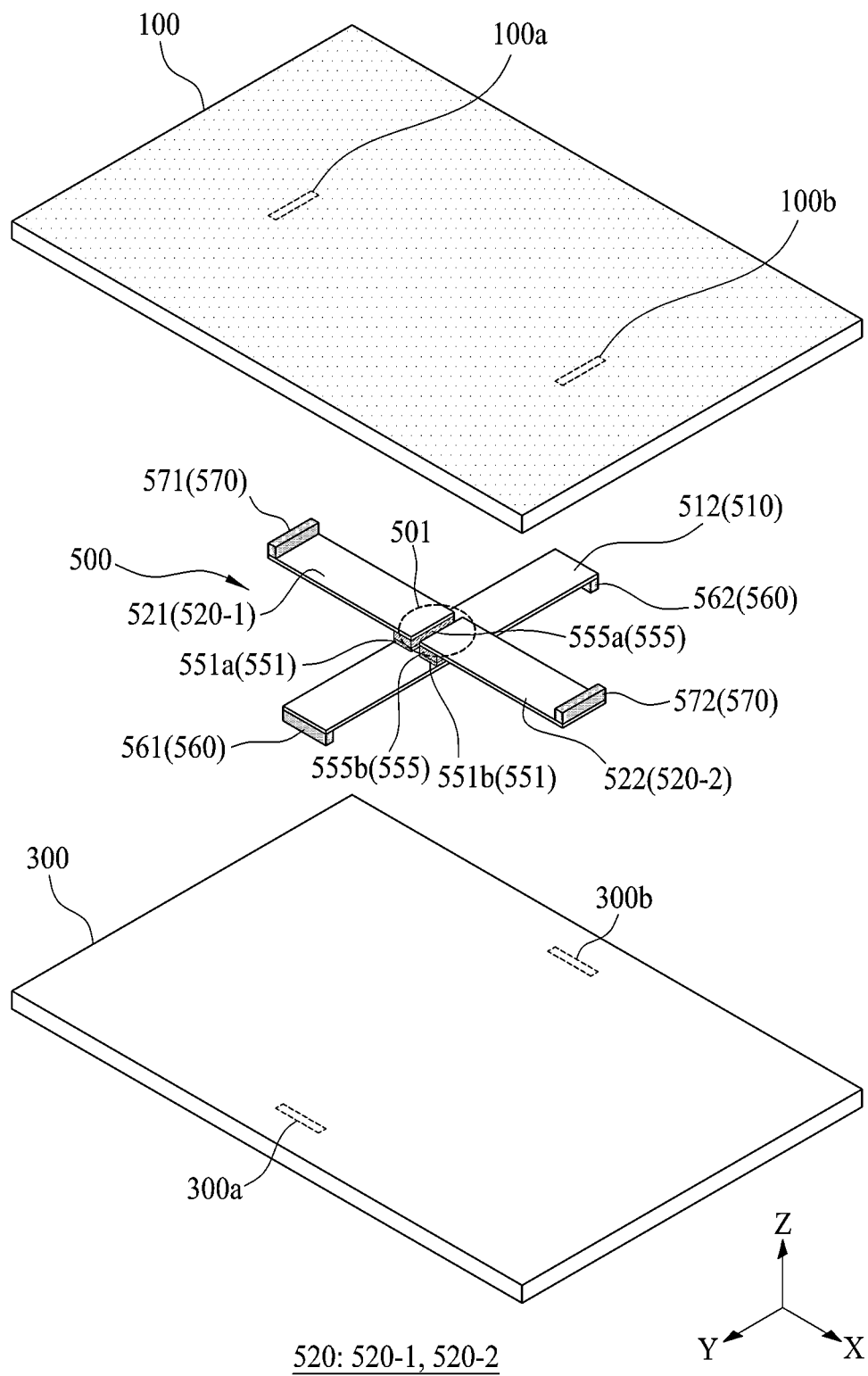
FIG. 9 is an exploded perspective view illustrating an apparatus according to another embodiment of the present disclosure illustrated in FIG. 1.

FIG. 9 is an exploded perspective view illustrating an apparatus according to another embodiment of the present disclosure illustrated in FIG. 1. FIG. 9 illustrates an embodiment implemented by modifying the first active vibration member in the apparatus described above with reference to FIGS. 1 to 8. Therefore, in the description of FIG. 9, the elements except the first active vibration member and relevant elements may be referred to by like reference numerals, and their repetitive descriptions may be omitted.

With reference to FIG. 9, in the vibration apparatus 500 according to another embodiment of the present disclosure, a first active vibration member 510 may be configured to have the same size as a second active vibration member 520. For example, the first active vibration member 510 may be configured to have the same size as a sum of (a) a size of a 2-1$^{st}$ active vibration member 520-1 and (b) a size of a 2-2$^{nd}$ active vibration member 520-2 of the second active vibration member 520. For example, a length of the first active vibration member 510 in the second direction Y may be configured to be a sum of (a) a length of the 2-1$^{st}$ active vibration member 520-1 in the first direction X and (b) a length of the 2-2$^{nd}$ active vibration member 520-2 in the first direction X. For example, a length of the first active vibration member 510 in the second direction Y may be configured to be a sum of (a) a length of the 2-1$^{st}$ active vibration member 520-1 in the first direction X, (b) a length of the 2-2$^{nd}$ active vibration member 520-2 in the first direction X and (c) the size (or a length) of the gap at the intersection portion 501 in the first direction X. For example, the first active vibration member 510 may be configured to have the same short-side length as a short-side length of each of the $2\text{-}1^{st}$ and $2\text{-}2^{nd}$ active vibration members 520-1 and 520-2 of the second active vibration member 520. Therefore, the first active vibration member 510 illustrated in FIG. 9 may have a size which is greater than the first active vibration member 510 illustrated in FIGS. 2 to 8, and thus, may have a vibration width (or displacement width) which is greater than the first active vibration member 510 illustrated in FIGS. 2 to 8.

The first active vibration member 510 according to another embodiment of the present disclosure may include a first vibration device 512.

The first vibration device 512 may be configured to have the same size as the second active vibration member 520. For example, the first vibration device 512 may be configured to have the same size as a sum of (a) a size of a $2\text{-}1^{st}$ vibration device 521 of the $2\text{-}1^{st}$ active vibration member 520-1 and (b) a size of a $2\text{-}2^{nd}$ vibration device 522 of the $2\text{-}2^{nd}$ active vibration member 520-2. For example, a length of the first vibration device 512 in the second direction Y may be configured to be a sum of (a) a length of the $2\text{-}1^{st}$ vibration device 521 in the first direction X and (b) a length of the $2\text{-}2^{nd}$ vibration device 522 in the first direction X. For example, the first vibration device 512 may be configured to have a size that is greater than a sum of (a) a size of a $2\text{-}1^{st}$ vibration device 521 of the $2\text{-}1^{st}$ active vibration member 520-1 and (b) a size of a $2\text{-}2^{nd}$ vibration device 522 of the $2\text{-}2^{nd}$ active vibration member 520-2. For example, the first vibration device 512 may be configured to have a size that is equal to a sum of (a) the size of a $2\text{-}1^{st}$ vibration device 521 of the $2\text{-}1^{st}$ active vibration member 520-1, (b) the size of a $2\text{-}2^{nd}$ vibration device 522 of the $2\text{-}2^{nd}$ active vibration member 520-2, and (c) the size of the gap at the intersection portion 501. For example, the first vibration device 512 may be configured to have a long-side length that is greater than a sum of (a) a long-side length of a $2\text{-}1^{st}$ vibration device 521 of the $2\text{-}1^{st}$ active vibration member 520-1 and (b) a long-side length of a $2\text{-}2^{nd}$ vibration device 522 of the $2\text{-}2^{nd}$ active vibration member 520-2. For example, the first vibration device 512 may be configured to have a long-side length that is a sum of (a) a long-side length of a $2\text{-}1^{st}$ vibration device 521 of the $2\text{-}1^{st}$ active vibration member 520-1, (b) a long-side length of a $2\text{-}2^{nd}$ vibration device 522 of the $2\text{-}2^{nd}$ active vibration member 520-2, and (c) the length of the gap at the intersection portion 501 along the length of the second active vibration member 520. For example, the first vibration device 512 may be configured to have the same short-side length as a short-side length of each of a $2\text{-}1^{st}$ vibration device 521 of the $2\text{-}1^{st}$ active vibration member 520-1 and a $2\text{-}2^{nd}$ vibration device 522 of the $2\text{-}2^{nd}$ active vibration member 520-2. Therefore, the first vibration device 512 illustrated in FIG. 9 may have a size which is greater than the first vibration device 511 illustrated in FIGS. 2 to 8, and thus, may have a vibration width (or displacement width) which is greater than the first vibration device 511 illustrated in FIGS. 2 to 8.

As described above, the vibration apparatus 500 according to another embodiment of the present disclosure may have a vibration width (or displacement width) which is greater than the vibration apparatus described above with reference to FIGS. 1 to 8, based on a size of the first active vibration member 510 or the first vibration device 512. Accordingly, a vibration width (or displacement width) of a passive vibration member 100 may further increase, and thus, a sound characteristic and a sound pressure level characteristic of a low-pitched sound band (for example, a super-low-pitched sound band (or an ultra-low-pitched sound band) of 100 Hz or less) generated based on a vibration of the passive vibration member 100 may be further enhanced.

Figure 10:
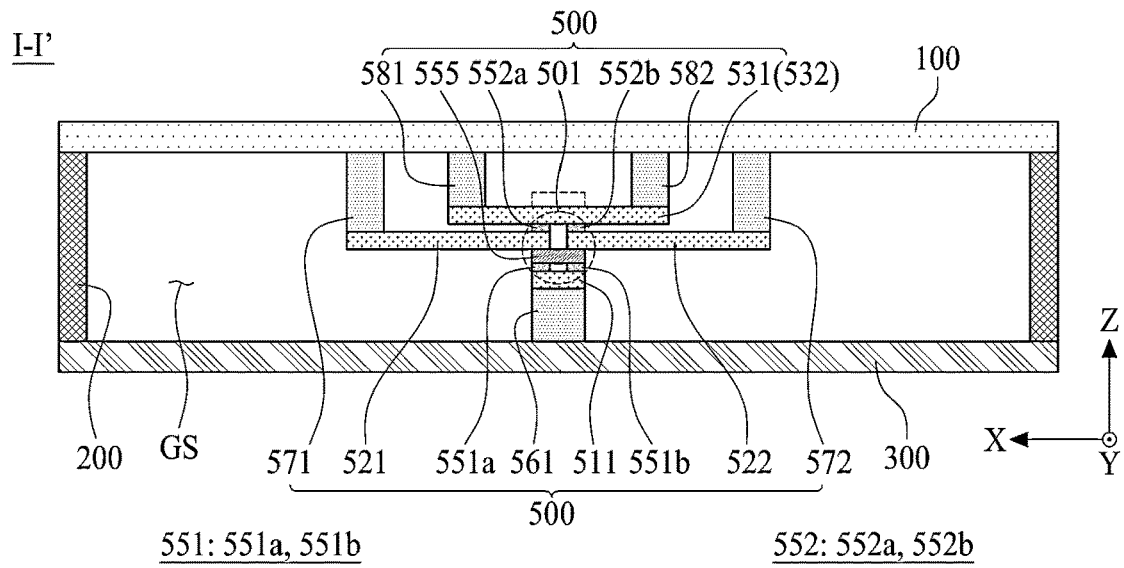
FIG. 10 is an example of another cross-sectional view taken along line I-I' illustrated in FIG. 1.
Figure 11:
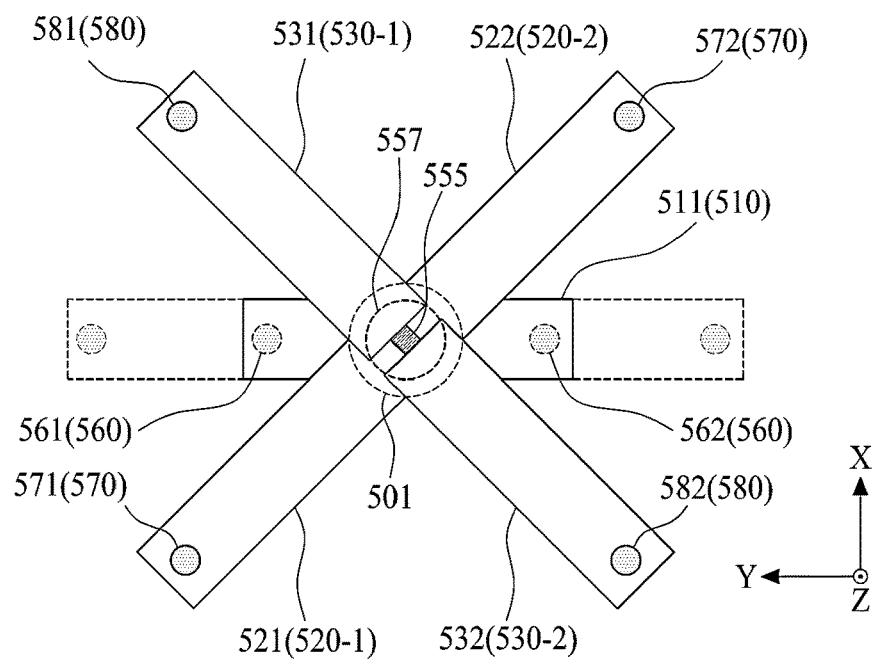
FIG. 11 is a plan view of a vibration apparatus according to another embodiment of the present disclosure illustrated in FIG. 10.
Figure 12:
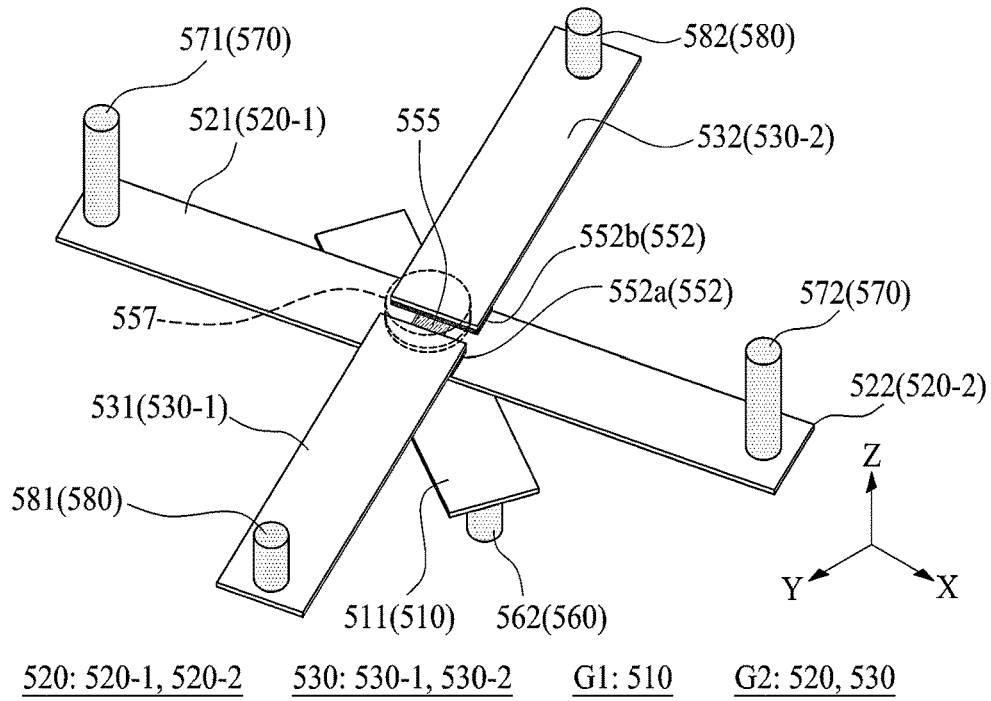
FIG. 12 is an example of a perspective view illustrating a vibration apparatus illustrated in FIGS. 10 and 11.

FIG. 10 is an example of another cross-sectional view taken along line I-I' illustrated in FIG. 1. FIG. 11 is a plan view of a vibration apparatus according to another embodiment of the present disclosure illustrated in FIG. 10. FIG. 12 is an example of a perspective view illustrating a vibration apparatus illustrated in FIGS. 10 and 11. FIGS. 10 to 12 illustrate an embodiment where a third active vibration member is additionally configured (or provided) in the apparatus or the vibration apparatus described above with reference to FIGS. 1 to 9. Therefore, in the description of FIGS. 10 to 12, the elements except a third active vibration member and relevant elements may be referred to by like reference numerals, and their repetitive descriptions may be omitted.

With reference to FIGS. 10 to 12, an apparatus or a vibration apparatus 500 according to another embodiment of the present disclosure may further include a third active vibration member 530.

The third active vibration member 530 may be disposed to intersect with each of first and second active vibration members 510 and 520. For example, the apparatus or the vibration apparatus 500 may include first to third active vibration members 510, 520, and 530 which are disposed to intersect with one another at an intersection portion 501 and are connected to one another at the intersection portion 501. For example, the first to third active vibration members 510, 520, and 530 may be disposed to have a "*"-shape in two dimensions.

According to an example embodiment of the present disclosure, the first to third active vibration members 510, 520, and 530 may be divided (or classified) into or may include a first group (or a first member group) G1 and a second group (or a second member group) G2, or may include the first group (or the first member group) G1 and the second group (or the second member group) G2. Each of the first group G1 and the second group G2 may include one or more of the first to third active vibration members 510, 520, and 530. For example, one or more active vibration member 510 of the first to third active vibration members 510, 520, and 530 may be included in the first group G1, and the other active vibration members 520 and 530 except the one or more active vibration member 510 in the first group G1 among the first to third active vibration members 510, 520, and 530 may be included in the second group G2. Accordingly, the vibration apparatus 500 may include the first group G1 and the second group G2 configured to include one or more active vibration members 510, 520, and 530.

The one or more active vibration member 510 in the first group G1 may be connected to a supporting member 300. The one or more active vibration members 520 and 530 in the second group G2 may be connected to a passive vibration member 100. For example, the first active vibration member 510 may be included in the first group G1, the second active vibration member 520 may be included in the second group G2, and the third active vibration member 530 may be included in the first group G1 or the second group G2. For example, the number of active vibration members in the second group G2 may be more than the number of active vibration members in the first group G1.

The third active vibration member 530 may be disposed to intersect with the second active vibration member 520 and may be connected to the second active vibration member 520 at the intersection portion 501. The third active vibration member 530 may be connected to a passive vibration member (or a second member) 100. For example, the third active vibration member 530 may be connected to the passive vibration member 100, so as to reinforce a sound characteristic and a sound pressure level characteristic of a low-pitched sound band, but embodiments of the present disclosure are not limited. For example, the third active vibration member 530 may be connected to the supporting member 300, so as to reinforce a sound characteristic and a sound pressure level characteristic of a high-pitched sound band.

The third active vibration member 530 may include a $3\text{-}1^{st}$ active vibration member 530-1 and a $3\text{-}2^{nd}$ active vibration member 530-2, which are each connected to the second active vibration member 520 and the passive vibration member 100. The $3\text{-}1^{st}$ active vibration member 530-1 and the $3\text{-}2^{nd}$ active vibration member 530-2 may be disposed along a direction intersecting with the second active vibration member 520 and may be spaced apart from each other at a center portion of the second active vibration member 520. For example, the $3\text{-}1^{st}$ active vibration member 530-1 and the $3\text{-}2^{nd}$ active vibration member 530-2 may be a pair of third active vibration members. In one or more aspects of the present disclosure, the $3\text{-}1^{st}$ active vibration member 530-1 and the $3\text{-}2^{nd}$ active vibration member 530-2 may be a fourth active vibration member and a fifth active vibration member, but embodiments of the present disclosure are not limited to the notations such as "$3\text{-}1^{st}$" and "$3\text{-}2^{nd}$".

The $3\text{-}1^{st}$ active vibration member 530-1 may include a $3\text{-}1^{st}$ vibration device 531, and the $3\text{-}2^{nd}$ active vibration member 530-2 may include a $3\text{-}2^{nd}$ vibration device 532. The $3\text{-}1^{st}$ vibration device 531 and the $3\text{-}2^{nd}$ vibration device 532 may be a pair of third vibration devices. The $3\text{-}1^{st}$ vibration device 531 and the $3\text{-}2^{nd}$ vibration device 532 may be disposed in parallel with each other along a direction intersecting with a first vibration device 511 and $2\text{-}1^{st}$ and $2\text{-}2^{nd}$ vibration devices 521 and 522 and may be spaced apart from each other at an intersection portion 501 over the first vibration device 511. In one or more aspects of the present disclosure, the $3\text{-}1^{st}$ vibration device 531 and the $3\text{-}2^{nd}$ vibration device 532 may be a fourth vibration device (or vibration apparatus) and a fifth vibration device (or vibration apparatus), but embodiments of the present disclosure are not limited to the notations such as "$3\text{-}1^{st}$" and "$3\text{-}2^{nd}$".

Each of the $3\text{-}1^{st}$ and $3\text{-}2^{nd}$ vibration devices 531 and 532 may be configured to have the same shape, size, and structure as each of the $2\text{-}1^{st}$ and $2\text{-}2^{nd}$ vibration devices 521 and 522. The first vibration device 511 of the first active vibration member 510 may have a length which is smaller than each of the $3\text{-}1^{st}$ and $3\text{-}2^{nd}$ vibration devices 531 and 532 and the $2\text{-}1^{st}$ and $2\text{-}2^{nd}$ vibration devices 521 and 522, but is not limited thereto and may have the same shape and size as each of the $3\text{-}1^{st}$ and $3\text{-}2^{nd}$ vibration devices 531 and 532 and the $2\text{-}1^{st}$ and $2\text{-}2^{nd}$ vibration devices 521 and 522.

The $3\text{-}1^{st}$ and $3\text{-}2^{nd}$ vibration devices 531 and 532 may vibrate (or displace or drive) based on the same driving signal. The driving signal applied to the $3\text{-}1^{st}$ and $3\text{-}2^{nd}$ vibration devices 531 and 532 may have the same phase (or in-phase) as a driving signal applied to the first vibration device 511, or may have opposite phases (or anti-phases) with respect to a phase of the driving signal applied to the first vibration device 511. The driving signal applied to the $3\text{-}1^{st}$ and $3\text{-}2^{nd}$ vibration devices 531 and 532 may have the same phase (or in-phase) as a driving signal applied to the $2\text{-}1^{st}$ and $2\text{-}2^{nd}$ vibration devices 521 and 522, or may have opposite phases (or anti-phases) with respect to a phase of the driving signal applied to the $2\text{-}1^{st}$ and $2\text{-}2^{nd}$ vibration devices 521 and 522.

According to an example embodiment of the present disclosure, driving signals applied to the first vibration device 511, the $2\text{-}1^{st}$ and $2\text{-}2^{nd}$ vibration devices 521 and 522, and the $3\text{-}1^{st}$ and $3\text{-}2^{nd}$ vibration devices 531 and 532 may have the same phase. For example, when the $3\text{-}1^{st}$ and $3\text{-}2^{nd}$ vibration devices 531 and 532 are connected to the passive vibration member 100, driving signals applied to the $3\text{-}1^{st}$ and $3\text{-}2^{nd}$ vibration devices 531 and 532 may have the same phase as driving signals applied to the $2\text{-}1^{st}$ and $2\text{-}2^{nd}$ vibration devices 521 and 522 and may have the same phase or an opposite phase (or an anti-phase) with respect to a phase of a driving signal applied to the first vibration device 511. For example, when the $3\text{-}1^{st}$ and $3\text{-}2^{nd}$ vibration devices 531 and 532 are connected to the supporting member 300, the driving signals applied to the $3\text{-}1^{st}$ and $3\text{-}2^{nd}$ vibration devices 531 and 532 may have the same phase or an opposite phase with respect to the driving signals applied to the $2\text{-}1^{st}$ and $2\text{-}2^{nd}$ vibration devices 521 and 522 and may have the same phase as the driving signal applied to the first vibration device 511. Accordingly, driving signals applied to the first vibration device 511, the $2\text{-}1^{st}$ and $2\text{-}2^{nd}$ vibration devices 521 and 522, and the $3\text{-}1^{st}$ and $3\text{-}2^{nd}$ vibration devices 531 and 532 may all have the same phase, or only a driving signal applied to a vibration device connected to the supporting member 300 may have an anti-phase.

According to an example embodiment of the present disclosure, one or more active vibration members in the first group G1 may include one vibration device 511 connected to the supporting member 300, one or more active vibration members in the second group G2 may include a pair of vibration devices (521, 522) and (531, 532) which intersect with the one vibration device 511 and are spaced apart from each other at the intersection portion 501.

The apparatus or the vibration apparatus 500 according to another embodiment of the present disclosure may further include a second adhesive member 552 and a third elastic member 580.

The second adhesive member 552 may be disposed between the second and third active vibration members 520 and 530. The second adhesive member 552 may be disposed between the $3\text{-}1^{st}$ active vibration member 531 and a first side of a first periphery portion of each of $2\text{-}1^{st}$ and $2\text{-}2^{nd}$ active vibration members 520-1 and 520-2 and may be disposed between the $3\text{-}2^{nd}$ active vibration member 532 and a second side of the first periphery portion of each of the $2\text{-}1^{st}$ and $2\text{-}2^{nd}$ active vibration members 520-1 and 520-2.

The second adhesive member 552 according to an example embodiment of the present disclosure may include a $2\text{-}1^{st}$ adhesive member 552a and a $2\text{-}2^{nd}$ adhesive member 552b. The second adhesive member 552 may be a second adhesive portion. For example, the $2\text{-}1^{st}$ adhesive member 552a and the $2\text{-}2^{nd}$ adhesive member 552b may be a pair of second adhesive members. In one or more aspects of the present disclosure, the $2\text{-}1^{st}$ adhesive member 552a and the $2\text{-}2^{nd}$ adhesive member 552b may be a third adhesive member and a fourth adhesive member, but embodiments of the present disclosure are not limited to the notations such as "$2\text{-}1^{st}$" and "$2\text{-}2^{nd}$".

The $2\text{-}1^{st}$ adhesive member (or a $2\text{-}1^{st}$ adhesive portion) 552a may be attached between the $3\text{-}1^{st}$ active vibration member 531 and the first side of the first periphery portion of each of the $2\text{-}1^{st}$ and $2\text{-}2^{nd}$ active vibration members 520-1 and 520-2. Accordingly, a first periphery portion of the $3\text{-}1^{st}$ active vibration member 531 may be connected to the first periphery portion of each of the 2-1$^{st}$ and 2-2$^{nd}$ active vibration members 520-1 and 520-2 by the 2-1$^{st}$ adhesive member 552a, and thus, may vibrate (or displace or drive) based on a vibration (or displacement or drive) of each of the first vibration device 511 and the 2-1$^{st}$ and 2-2$^{nd}$ active vibration members 520-1 and 520-2.

The 2-2$^{nd}$ adhesive member (or a 2-2$^{nd}$ adhesive portion) 552b may be attached between the 3-2$^{nd}$ active vibration member 532 and the second side of the first periphery portion of each of the 2-1$^{st}$ and 2-2$^{nd}$ active vibration members 520-1 and 520-2. Accordingly, a first periphery portion of the 3-2$^{nd}$ active vibration member 532 may be connected to the first periphery portion of each of the 2-1$^{st}$ and 2-2$^{nd}$ active vibration members 520-1 and 520-2 by the 2-2$^{nd}$ adhesive member 552b, and thus, may vibrate (or displace or drive) based on a vibration (or displacement) of each of the first vibration device 511 and the 2-1$^{st}$ and 2-2$^{nd}$ active vibration members 520-1 and 520-2.

The second adhesive members 552, 552a, and 552b may include a material which is substantially the same as the first adhesive members 551, 551a, and 551b, and thus, their detailed descriptions may be omitted.

The third elastic member 580 may be connected between the third active vibration member 530 and the passive vibration member (or the second member) 100. For example, the third elastic member 580 may be connected between the passive vibration member 100 and each of a 3-1$^{st}$ active vibration member 530-1 and a 3-2$^{nd}$ active vibration member 530-2 of the third active vibration member 530. For example, the third elastic member 580 may be connected between the passive vibration member 100 and a second periphery portion of a pair of third active vibration members 531 and 532. Accordingly, a second periphery portion of each of the 3-1$^{st}$ active vibration member 530-1 and the 3-2$^{nd}$ active vibration member 530-2 may be connected to the passive vibration member 100 by the third elastic member 580, and thus, may vibrate (or displace or drive) the passive vibration member 100.

The third elastic member 580 according to an example embodiment of the present disclosure may include a 3-1$^{st}$ elastic member 581 and a 3-2$^{nd}$ elastic member 582. For example, the third elastic member 580 may support a third elastic portion or a third elastic supporting portion. For example, the 3-1$^{st}$ elastic member 581 and the 3-2$^{nd}$ elastic member 582 may be a pair of third elastic members or a pair of third elastic members. In one or more aspects of the present disclosure, the 3-1$^{st}$ elastic member 581 and the 3-2$^{nd}$ elastic member 582 may be a fifth elastic member and a sixth elastic member, but embodiments of the present disclosure are not limited to the notations such as "3-1$^{st}$" and "3-2$^{nd}$".

The 3-1$^{st}$ elastic member (or 3-1$^{st}$ elastic portion) 581 may be connected between the passive vibration member 100 and a second periphery portion of the 3-1$^{st}$ vibration device 531. The 3-1$^{st}$ elastic member 581 may elastically or flexibly support the second periphery portion of the 3-1$^{st}$ vibration device 531. For example, the second periphery portion of the 3-1$^{st}$ vibration device 531 may be connected to the passive vibration member 100 by the 3-1$^{st}$ elastic member 581 so as to enable a vibration (or displacement or drive). The 3-1$^{st}$ elastic member 581 may be configured with or as an elastic body which is substantially the same as the second elastic member 570 described above with reference to FIGS. 2 and 3, and thus, the repetitive description thereof may be omitted. The 3-1$^{st}$ elastic member 581 may increase a mass (or weight) of the 3-1$^{st}$ vibration device 531, and thus, may act as a mass (or mass body) which decreases a resonance frequency (or natural frequency) of the 3-1$^{st}$ vibration device 531. This may be substantially the same as the 2-1$^{st}$ elastic member 571, and thus, the repetitive description thereof may be omitted.

The 3-2$^{nd}$ elastic member (or 3-2$^{nd}$ elastic portion) 582 may be connected between the passive vibration member 100 and a second periphery portion of the 3-2$^{nd}$ vibration device 532. The 3-2$^{nd}$ elastic member 582 may elastically or flexibly support the second periphery portion of the 3-2$^{nd}$ vibration device 532. For example, the second periphery portion of the 3-2$^{nd}$ vibration device 532 may be connected to the passive vibration member 100 by the 3-2$^{nd}$ elastic member 582 so as to enable a vibration (or displacement). The 3-2$^{nd}$ elastic member 582 may be configured with or as an elastic body which is substantially the same as the second elastic member 570 described above with reference to FIGS. 2 and 3, and thus, the repetitive description thereof may be omitted. The 3-2$^{nd}$ elastic member 582 may increase a mass (or weight) of the 3-2$^{nd}$ vibration device 532, and thus, may act as a mass (or mass body) which decreases a resonance frequency (or natural frequency) of the 3-2$^{nd}$ vibration device 532. This may be substantially the same as the 2-2$^{nd}$ elastic member 572, and thus, the repetitive description thereof may be omitted.

According to another embodiment of the present disclosure, first and second periphery portions of one vibration device 511 configured in an active vibration member of the first group G1 may be connected to the supporting member 300 by at least a pair of first elastic members 561 and 562. The second periphery portion of each of at least a pair of vibration devices (521, 522) and (531, 532) provided in an active vibration member of the second group G2 may be connected to the passive vibration member 100 by at least a pair of second elastic members (571, 572) and (581, 582).

In the apparatus or the vibration apparatus 500 according to another embodiment of the present disclosure, each of the first and second adhesive members 551 and 552 may be configured to have a polygonal pillar shape or a circular pillar shape having a size which is smaller than or equal to a center portion (or intersection portion 501) of the first vibration device 511.

As described above, the vibration apparatus 500 according to another embodiment of the present disclosure may have a vibration width (or displacement width) which is greater than the vibration apparatus described above with reference to FIGS. 1 to 9, based on a composite vibration (or combined vibration) of the first to third active vibration members 510, 520, and 530. For example, a vibration generated in each of the vibration devices 511, 521, 522, 531, and 532 configured in the first to third active vibration members 510, 520, and 530 may be reinforced with each other, and thus, vibration efficiency may be enhanced. Accordingly, a displacement amount (or displacement width) of the passive vibration member 100 may further increase, and thus, a sound characteristic and a sound pressure level characteristic of a low-pitched sound band (for example, a super-low-pitched sound band (or an ultra-low-pitched sound band) of 100 Hz or less) generated based on a vibration of the passive vibration member 100 may be further enhanced.

The apparatus or the vibration apparatus 500 according to another embodiment of the present disclosure may further include a secondary mass member 557 for increasing a mass (or weight) of each of the first vibration device 511, the 2-1$^{st}$ and 2-2$^{nd}$ vibration devices 521 and 522, and the 3-1$^{st}$ and 3-2$^{nd}$ vibration devices 531 and 532.

The secondary mass member 557 may be disposed to overlap with the intersection portion 501. As an example embodiment of the present disclosure, the secondary mass member 557 may be connected to a third active vibration member 530, but embodiments of the present disclosure are not limited thereto. As another example embodiment of the present disclosure, the secondary mass member 557 may be connected to a rear center portion of the first vibration device 511. For example, the secondary mass member 557 may overlap with the mass member 555. The secondary mass member 557 may include an elastic material which is the same as the mass member 555. For example, the secondary mass member 557 may be configured to have a polygonal pillar shape or a circular pillar shape having a size which is smaller than or equal to the intersection portion 501. Accordingly, the apparatus or the vibration apparatus 500 according to another embodiment of the present disclosure may further include a secondary mass member 557, and thus, a sound characteristic and a sound pressure level characteristic of a super-low-pitched sound band (or an ultra-low-pitched sound band) of 100 Hz or less generated based on a vibration of the passive vibration member 100 may be further enhanced.

Figure 13:
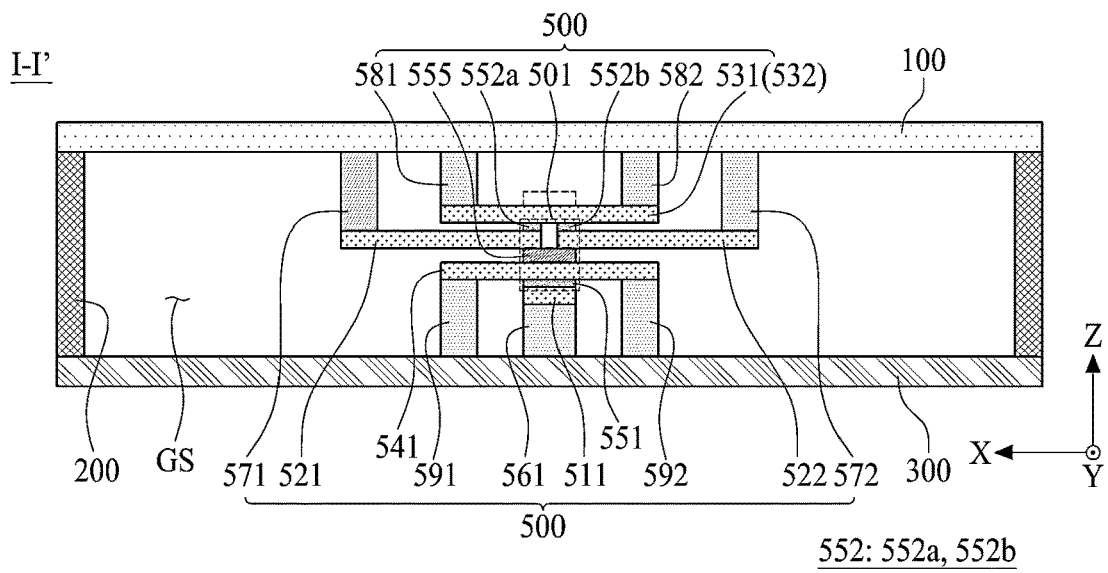
FIG. 13 is an example of another cross-sectional view taken along line I-I' illustrated in FIG. 1.
Figure 14:
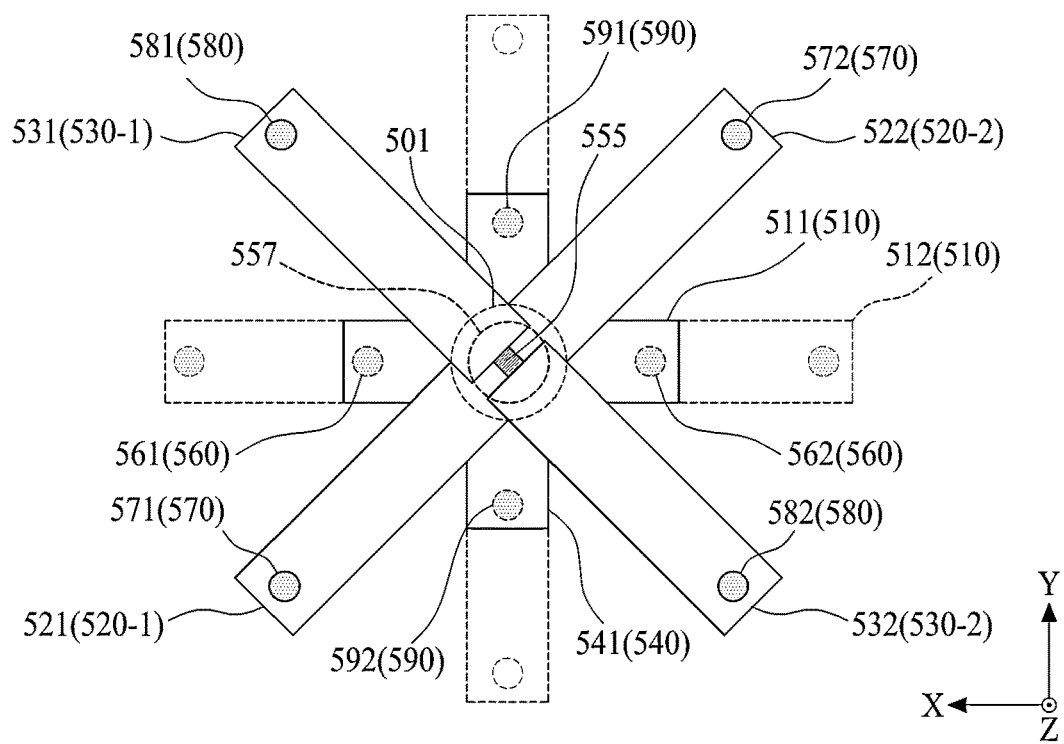
FIG. 14 is an example of a plan view of a vibration apparatus illustrated in FIG. 13.

FIG. 13 is an example of another cross-sectional view taken along line I-I' illustrated in FIG. 1. FIG. 14 is an example of a plan view of a vibration apparatus illustrated in FIG. 13. FIGS. 13 and 14 illustrate an embodiment where a fourth active vibration member is additionally configured in the apparatus or the vibration apparatus described above with reference to FIGS. 10 to 12. Therefore, in the description of FIGS. 13 and 14, the elements except a fourth active vibration member and relevant elements may be referred to by like reference numerals, and their repetitive descriptions may be omitted.

With reference to FIGS. 13 and 14, an apparatus or a vibration apparatus according to another embodiment of the present disclosure may further include a fourth active vibration member 540.

The fourth active vibration member 540 may be disposed to intersect with each of first to third active vibration members 510, 520, and 530. For example, the apparatus or the vibration apparatus 500 may include the first to fourth active vibration members 510, 520, 530, and 540 which are disposed to intersect with one another at an intersection portion 501 and are connected to one another at the intersection portion 501. For example, the first to fourth active vibration members 510, 520, 530, and 540 may be arranged at a 45-degree interval with respect to an intersection portion 501 two-dimensionally, but embodiments of the present disclosure are not limited. For example, the first and fourth active vibration members 510 and 540 may be arranged to have a "+"-shape two-dimensionally, and the second and third active vibration members 520 and 530 may be arranged to have a "x"-shape two-dimensionally.

According to an example embodiment of the present disclosure, the first to fourth active vibration members 510, 520, 530, and 540 may be divided (or classified) into or may include a first group (or a first member group) G1 and a second group (or a second member group) G2, or may include the first group (or the first member group) G1 and the second group (or the second member group) G2. Each of the first group G1 and the second group G2 may include one or more of the first to fourth active vibration members 510, 520, 530, and 540. For example, one or more active vibration members 510 and 540 of the first to fourth active vibration members 510, 520, 530, and 540 may be included in the first group G1, and the other active vibration members 520 and 530 except the one or more active vibration members 510 and 540 in the first group G1 among the first to fourth active vibration members 510, 520, 530, and 540 may be included in the second group G2. Accordingly, the vibration apparatus 500 may include the first group G1 and the second group G2 configured to include one or more active vibration members 510, 520, 530, and 540.

The one or more active vibration members 510 and 540 in the first group G1 may be connected to a supporting member 300. The one or more active vibration members 520 and 530 in the second group G2 may be connected to a passive vibration member 100. For example, the first active vibration member 510 may be included in the first group G1, the second active vibration member 520 may be included in the second group G2, the third active vibration member 530 may be included in the first group G1 or the second group G2, and the fourth active vibration member 540 may be included in the first group G1 or the second group G2. For example, the number of active vibration members in the second group G2 may be more than the number of active vibration members in the first group G1.

The fourth active vibration member 540 may be disposed to intersect with the first active vibration member 510 and may be connected to each of the first active vibration member 510 and the second active vibration member 520 at the intersection portion 501. The fourth active vibration member 540 may be connected to the supporting member (or a first member) 300. For example, the fourth active vibration member 540 may be connected to the passive vibration member 100, so as to reinforce a sound characteristic and a sound pressure level characteristic of a low-pitched sound band, but embodiments of the present disclosure are not limited. For example, the fourth active vibration member 540 may be connected to the supporting member 300, so as to reinforce a sound characteristic and a sound pressure level characteristic of a high-pitched sound band.

The fourth active vibration member 540 may include one fourth vibration device 541 which is disposed between the first active vibration member 510 and the second active vibration member 520.

A center portion of the fourth vibration device 541 may be disposed to intersect with a center portion of the first active vibration member 510 and may be disposed to intersect with each of 2-$1^{st}$ and 2-$2^{nd}$ vibration devices 521 and 522 of the second active vibration member 520. First and second periphery portions of the fourth vibration device 541 may be connected to the supporting member 300, but embodiments of the present disclosure are not limited thereto and may be connected to the passive vibration member 100.

According to an example embodiment of the present disclosure, the center portion of the fourth vibration device 541 may be connected to a center portion of the first active vibration member 510 by a first adhesive member 551 and may be connected to a first periphery portion of each of the 2-$1^{st}$ and 2-$2^{nd}$ vibration devices 521 and 522 of the second active vibration member 520 by an additional adhesive member.

According to another embodiment of the present disclosure, the center portion of the fourth vibration device 541 may be connected between the first adhesive member 551 and a mass member 555. For example, the center portion of the fourth vibration device 541 may be connected to a center portion of the first active vibration member 510 by the adhesive member 551 and may be connected to the first periphery portion of each of the 2-$1^{st}$ and 2-$2^{nd}$ vibration devices 521 and 522 by the mass member 555. Therefore, an additional adhesive member for connecting each of the 2-$1^{st}$ and 2-2$^{nd}$ vibration devices 521 and 522 to the fourth vibration device 541 may be omitted.

The fourth vibration device 541 may have the same shape and structure as the first vibration device 511. The fourth vibration device 541 may have a length which is smaller than each of the 3-1$^{st}$ and 3-2$^{nd}$ vibration devices 531 and 532 and the 2-1$^{st}$ and 2-2$^{nd}$ vibration devices 521 and 522, but embodiments of the present disclosure are not limited thereto and may have the same shape and size as each of the 3-1$^{st}$ and 3-2$^{nd}$ vibration devices 531 and 532 and the 2-1$^{st}$ and 2-2$^{nd}$ vibration devices 521 and 522 as illustrated by a dotted line in FIG. 14.

The fourth vibration device 541 may vibrate (or displace or drive) based on a driving signal applied thereto. The driving signal applied to the fourth vibration device 541 may have the same phase or an opposite phase (or an anti-phase) with respect to a phase of a driving signal applied to each of the first vibration device 511, the 2-1$^{st}$ and 2-2$^{nd}$ vibration devices 521 and 522, and the 3-1$^{st}$ and 3-2$^{nd}$ vibration devices 531 and 532. For example, the driving signal applied to each of the first vibration device 511, the 2-1$^{st}$ and 2-2$^{nd}$ vibration devices 521 and 522, the 3-1$^{st}$ and 3-2$^{nd}$ vibration devices 531 and 532, and fourth vibration device 541 may all have the same phase (or in-phase), or only a driving signal applied to a vibration device connected to the supporting member 300 may have an anti-phase.

According to an example embodiment of the present disclosure, one or more active vibration members in the first group G1 may include one or more vibration devices 511 or/and 541 connected to the supporting member 300, and one or more active vibration members in the second group G2 may include at least a pair of vibration devices (521, 522) or/and (531, 532) which intersect with the one vibration device 511 or/and 541 in the first group G1 and are spaced apart from each other at the intersection portion 501.

The apparatus or the vibration apparatus 500 according to another embodiment of the present disclosure may further include a fourth elastic member 590.

The fourth elastic member 590 may be connected between the supporting member (or a first member) 300 and the fourth active vibration member 540. For example, the fourth elastic member 590 may be connected between the supporting member 300 and first and second periphery portions of the fourth active vibration member 540. Accordingly, the first and second periphery portions of the fourth active vibration member 540 may be connected to the supporting member 300 by the fourth elastic member 590.

The fourth elastic member 590 according to an example embodiment of the present disclosure may include a 4-1$^{st}$ elastic member 591 and a 4-2$^{nd}$ elastic member 592. For example, the fourth elastic member 590 may support a fourth elastic portion or a fourth elastic supporting portion. For example, the 4-1$^{st}$ elastic member 591 and the 4-2$^{nd}$ elastic member 592 may be a pair of fourth elastic members or a pair of fourth elastic members. In one or more aspects of the present disclosure, the 4-1$^{st}$ elastic member 591 and the 4-2$^{nd}$ elastic member 592 may be a seventh elastic member and an eighth elastic member, but embodiments of the present disclosure are not limited to the notations such as "4-1$^{st}$" and "4-2$^{nd}$".

The 4-1$^{st}$ elastic member (or 4-1$^{st}$ elastic portion) 591 may be connected between the supporting member 300 and a first periphery portion of the fourth vibration device 541. The 4-1$^{st}$ elastic member 591 may elastically or flexibly support the first periphery portion of the fourth vibration device 541. The 4-1$^{st}$ elastic member 591 may be configured with or as an elastic body which is substantially the same as the 1-1$^{st}$ elastic member 561 of the first elastic member 560 described above with reference to FIGS. 2 and 3, and thus, the repetitive description thereof may be omitted.

The 4-2$^{nd}$ elastic member (or 4-2$^{nd}$ elastic portion) 592 may be connected between the supporting member 300 and a second periphery portion of the fourth vibration device 541. The 4-2$^{nd}$ elastic member 592 may elastically or flexibly support the second periphery portion of the fourth vibration device 541. The 4-2$^{nd}$ elastic member 592 may be configured with or as an elastic body which is substantially the same as the 1-2$^{nd}$ elastic member 562 of the first elastic member 560 described above with reference to FIGS. 2 and 3, and thus, the repetitive description thereof may be omitted.

The fourth elastic member 590 or the 4-1$^{st}$ elastic member 591 and 4-2$^{nd}$ elastic member 592 may increase a mass (or weight) of the fourth vibration device 541, and thus, may act as a mass (or mass body) which decreases a resonance frequency (or natural frequency) of the fourth vibration device 541. This may be substantially the same as the first elastic member 560, and thus, the repetitive description thereof may be omitted.

According to another embodiment of the present disclosure, first and second periphery portions of one or more vibration devices 511 and 541 configured in an active vibration member of the first group G1 may be connected to the supporting member 300 by at least a pair of first elastic members (561, 562) and (591, 592). The second periphery portions of each of at least a pair of vibration devices (521, 522) and (531, 532) provided in an active vibration member of the second group G2 may be connected to the passive vibration member 100 by at least a pair of second elastic members (571, 572) and (581, 582).

In the apparatus or the vibration apparatus 500 according to another embodiment of the present disclosure, each of the first and second adhesive members 551 and 552 may be configured to have a polygonal pillar shape or a circular pillar shape having a size which is smaller than or equal to a center portion (or intersection portion 501) of the first vibration device 511.

In the apparatus or the vibration apparatus 500 according to another embodiment of the present disclosure, the mass member 555 may be configured to have a polygonal pillar shape or a circular pillar shape having a size which is smaller than or equal to a center portion (or intersection portion 501) of the first vibration device 511.

The mass member 555 according to another embodiment of the present disclosure may be disposed between the first group G1 and the second group G2. For example, with respect to a thickness direction Z of the passive vibration member 100, the mass member 555 may be disposed between an active vibration member disposed at an uppermost layer of the first group G1 and an active vibration member disposed at a lowermost layer of the second group G2.

As described above, the vibration apparatus 500 according to another embodiment of the present disclosure may have a vibration width (or displacement width) which is greater than the vibration apparatus described above with reference to FIGS. 1 to 12, based on a composite vibration (or combined vibration) of the first to fourth active vibration members 510, 520, 530, and 540. For example, a vibration generated in each of the vibration devices 511, 521, 522, 531, and 532 configured in the first to fourth active vibration members 510, 520, 530, and 540 may be reinforced with each other, and thus, vibration efficiency may be enhanced. Accordingly, a displacement amount (or displacement width) of the passive vibration member 100 may further increase, and thus, a sound characteristic and a sound pressure level characteristic of a low-pitched sound band (for example, a super-low-pitched sound band (or an ultra-low-pitched sound band) of 100 Hz or less) generated based on a vibration of the passive vibration member 100 may be further enhanced.

The mass member 555 according to another embodiment of the present disclosure may further include one or more secondary mass members 557 which are connected to one or more of the first group G1 and the second group G2. The one or more secondary mass members 557 may be configured to increase a mass (or weight) of each of the first vibration device 511, the 2-1$^{st}$ and 2-2$^{nd}$ vibration devices 521 and 522, the 3-1$^{st}$ and 3-2$^{nd}$ vibration devices 531 and 532, and the fourth vibration device 541.

According to another embodiment of the present disclosure, the one or more secondary mass members 557 may be disposed at one or more of a rear center portion of an active vibration member disposed at a lowermost layer of the first group G1 and a front center portion of an active vibration member disposed at an uppermost layer of the second group G2, with respect to the thickness direction Z of the passive vibration member 100. The one or more secondary mass members 557 may include the same elastic material as the mass member 555. The one or more secondary mass member 557 may be configured to have a polygonal pillar shape or a circular pillar shape having a size which is smaller than or equal to the intersection portion 501.

Therefore, the apparatus or the vibration apparatus 500 according to another embodiment of the present disclosure may include the mass members 555 and 557 disposed at one or more of a portion between the active vibration member disposed at the uppermost layer of the first group G1 and the active vibration member disposed at the lowermost layer of the second group G2, the rear center portion of the active vibration member disposed at the lowermost layer of the first group G1, and the front center portion of the active vibration member disposed at the uppermost layer of the second group G2, and thus, a sound characteristic and a sound pressure level characteristic of a super-low-pitched sound band (or an ultra-low-pitched sound band) of 100 Hz or less generated based on a vibration of the passive vibration member 100 may be further enhanced.

Figure 15:
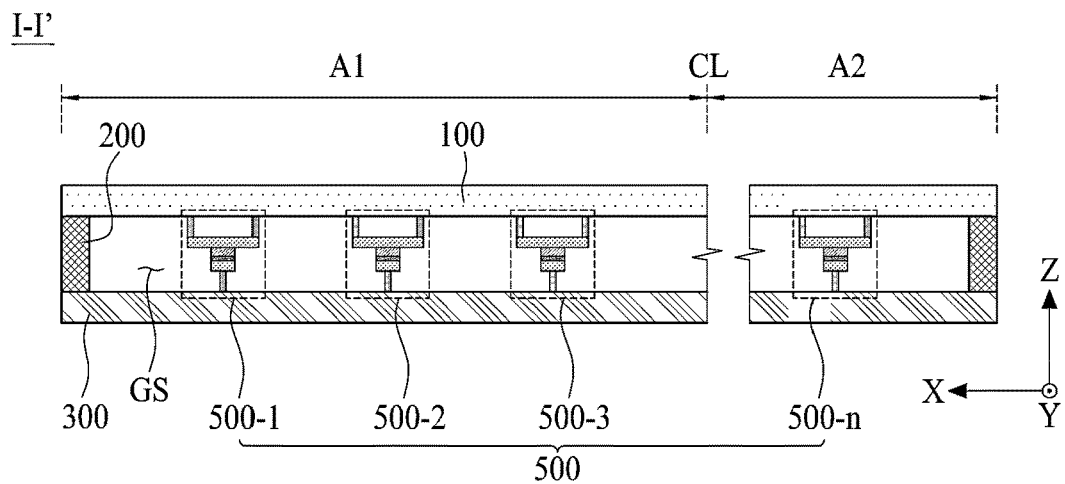
FIG. 15 is an example of another cross-sectional view taken along line I-I' illustrated in FIG. 1.

FIG. 15 is an example of another cross-sectional view taken along line I-I' illustrated in FIG. 1. FIG. 15 illustrates an embodiment where a plurality of vibration apparatuses are configured (or provided) in the apparatus described above with reference to FIGS. 1 to 14. Therefore, in the following description, the elements except a plurality of vibration apparatuses and relevant elements may be referred to by like reference numerals, and their repetitive descriptions may be omitted.

With reference to FIG. 15, an apparatus according to another embodiment of the present disclosure may include a plurality of vibration apparatuses 500-1 to 500-$n$ which are connected between a passive vibration member 100 and a supporting member 300.

According to another embodiment of the present disclosure, each of the plurality of vibration apparatuses 500-1 to 500-$n$ may be configured as one of the vibration apparatus 500 described above with reference to FIGS. 1 to 5, the vibration apparatus 500 described above with reference to FIGS. 6 and 8, the vibration apparatus 500 described above with reference to FIG. 9, the vibration apparatus 500 described above with reference to FIGS. 10 to 12, and the vibration apparatus 500 described above with reference to FIGS. 13 and 15. For example, each of the plurality of vibration apparatuses 500-1 to 500-$n$ may be configured as the same vibration apparatus or a different vibration apparatus of the vibration apparatuses 500 described above with reference to FIGS. 1 to 15. Accordingly, a repetitive description of each of the plurality of vibration apparatuses 500-1 to 500-$n$ may be omitted. In one or more aspects, n may represent a natural number. In one or more examples, n may represent a natural number greater than 1.

According to another embodiment of the present disclosure, the plurality of vibration apparatuses 500-1 to 500-$n$ may be divided (or classified) into or may include a first apparatus group and a second apparatus group, or may include the first apparatus group and the second apparatus group. Each of the first apparatus group and the second apparatus group may include one or more of the plurality of vibration apparatuses 500-1 to 500-$n$. For example, one or more of the plurality of vibration apparatuses 500-1 to 500-$n$ may be included in the first apparatus group, and one or more other vibration apparatuses except the one or more vibration apparatuses included in the first apparatus group among the plurality of vibration apparatuses 500-1 to 500-$n$ may be included in the second apparatus group. For example, the first apparatus group may be a first vibration portion, a first vibration group, or a first driving group, and the second apparatus group may be a second vibration portion, a second vibration group, or a second driving group.

The number of vibration apparatuses 500-1 to 500-$n$ in the first apparatus group may be equal to or different from the number of vibration apparatuses 500-1 to 500-$n$ in the second apparatus group.

According to another embodiment of the present disclosure, the plurality of vibration apparatuses 500-1 to 500-$n$ may be divided (or classified) into or may include the first apparatus group and the second apparatus group based on an arrangement position, or may include the first apparatus group and the second apparatus group. For example, with respect to an arrangement position disposed along a first direction X and/or a second direction Y, odd-numbered vibration apparatuses 500-1, 500-3, and so on of the plurality of vibration apparatuses 500-1 to 500-$n$ may be included in the first apparatus group, and even-numbered vibration apparatuses 500-2, 500-4, . . . , and 500-$n$ of the plurality of vibration apparatuses 500-1 to 500-$n$ may be included in the second apparatus group.

According to another embodiment of the present disclosure, with respect to a center line CL, the passive vibration member 100 may include a first region A1 and a second region A2. For example, the first region A1 may be a left region of the passive vibration member 100, and the second region A2 may be a right region of the passive vibration member 100. Accordingly, one or more of vibration apparatuses 500-1, 500-2, 500-3, and so on disposed at the first region A1 of the passive vibration member 100 among the plurality of vibration apparatuses 500-1 to 500-$n$ may be included in the first apparatus group, and one or more of vibration apparatuses 500-1, 500-2 . . . , and 500-$n$ disposed at the second region A2 of the passive vibration member 100 among the plurality of vibration apparatuses 500-1 to 500-$n$ may be included in the second apparatus group.

According to another embodiment of the present disclosure, a driving signal applied to one or more vibration apparatuses in the first apparatus group may be equal to a driving signal applied to one or more vibration apparatuses in the second apparatus group. For example, in the one or more vibration apparatuses in the first apparatus group, a driving signal applied to one or more active vibration members in a first group among a plurality of active vibration members and a driving signal applied to one or more active vibration members in a second group among the plurality of active vibration members may have the same phase, and in the one or more vibration apparatuses in the second apparatus group, a driving signal applied to one or more active vibration members in a first group among a plurality of active vibration members and a driving signal applied to one or more active vibration members in a second group among the plurality of active vibration members may have the same phase.

According to another embodiment of the present disclosure, a driving signal applied to one or more vibration apparatuses in the first apparatus group may differ from a driving signal applied to one or more vibration apparatuses in the second apparatus group. For example, in the one or more vibration apparatuses in the first apparatus group, a driving signal applied to one or more active vibration members in a first group among a plurality of active vibration members and a driving signal applied to one or more active vibration members in a second group among the plurality of active vibration members may have the same phase, and in the one or more vibration apparatuses in the second apparatus group, a driving signal applied to one or more active vibration members in a first group among a plurality of active vibration members and a driving signal applied to one or more active vibration members in a second group among the plurality of active vibration members may have an opposite phase (or an anti-phase).

In each of the plurality of vibration apparatuses 500-1 to **500-*n*, when a driving signal applied to one or more active vibration members in a first group among a plurality of active vibration members and a driving signal applied to one or more active vibration members in a second group among the plurality of active vibration members have the same phase, a vibration width (or displacement width) of a vibration apparatus may considerably increase, thereby enhancing a sound characteristic and a sound pressure level characteristic of a low-pitched sound band generated based on a vibration of the passive vibration member 100. Accordingly, a driving signal applied to one or more vibration apparatuses in the first apparatus group and a driving signal applied to one or more vibration apparatuses in the second apparatus group may be varied (or controlled) to be equal or differ, based on a sound source. For example, when a sound of 100 Hz or less is included in a sound source, driving signals applied to a plurality of active vibration members provided in the plurality of vibration apparatuses 500-1 to 500-*n*** may be varied (or controlled) to all have the same phase.

As described above, the apparatus according to another embodiment of the present disclosure may vary (or control) a phase of a driving signal, applied to each of the plurality of vibration apparatuses 500-1 to **500-*n*, to an in-phase or an anti-phase based on the sound source, and thus, may output (or generate) a sound which is optimized for or correspond to the sound source, based on a vibration of the passive vibration member 100**.

Figure 16:
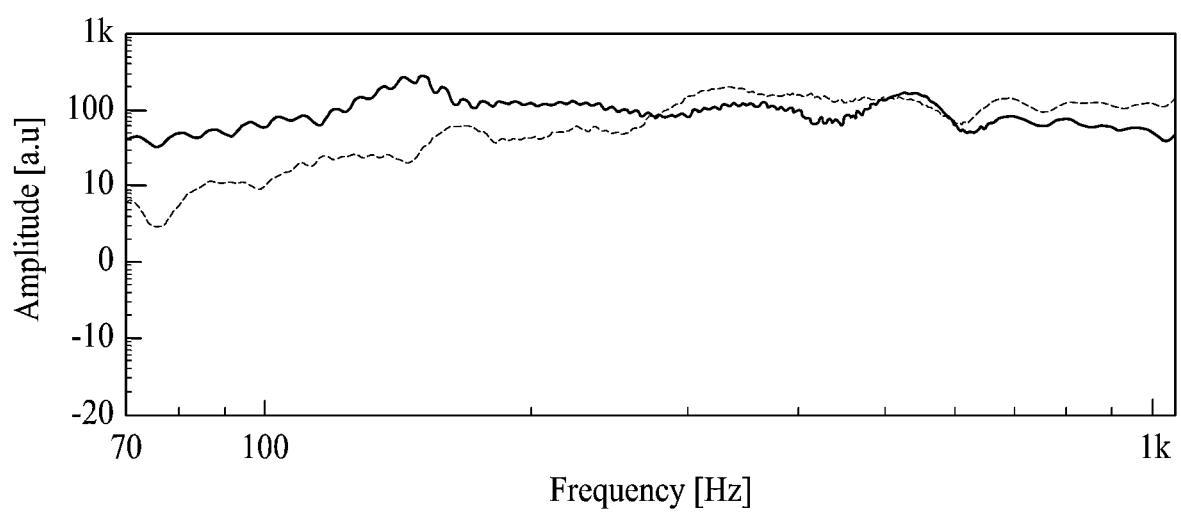
FIG. 16 is a graph showing an output characteristic of a sound of a low-pitched sound band in an apparatus according to an example embodiment of the present disclosure and an apparatus according to an experimental example.

FIG. 16 is a graph showing an output characteristic of a sound of a low-pitched sound band in an apparatus according to an example embodiment of the present disclosure and an apparatus according to an experimental example. In FIG. 16, the abscissa axis represents a frequency (Hz), and the ordinate axis represents an amplitude. The amplitude is a number (or a digit) expressed as a relative value with respect to a maximum amplitude. In addition, FIG. 16 shows a log-log scale graph. A dotted line in FIG. 16 represents an output characteristic of a sound of the low-pitched sound band in the apparatus according to the experimental example, and a solid line in FIG. 16 represents an output characteristic of a sound of the low-pitched sound band in the apparatus according to an example embodiment of the present disclosure described above with reference to FIGS. 2 and 3. The apparatus according to the experimental example includes two piezoelectric devices connected to each other to intersect with each other and an elastic member connected between an intersection portion of the two piezoelectric devices and a rear surface of a passive vibration member.

As seen in FIG. 16, comparing with the apparatus according to the experimental example, in the apparatus according to an example embodiment of the present disclosure, it may be seen that an amplitude in about 300 Hz or less increases. For example, in about 100 Hz or less, it may be seen that the apparatus according to the experimental example has an amplitude of about 10 or less, and the apparatus according to an example embodiment of the present disclosure has an amplitude of about 30 or more. Addition, in about 70 Hz or less, it may be seen that the apparatus according to the experimental example has an amplitude of about 5 and the apparatus according to an example embodiment of the present disclosure has an amplitude of about 30. Accordingly, comparing with the experimental example, the apparatus according to an example embodiment of the present disclosure may have a relatively high amplitude in about 300 Hz or less, and thus, a sound characteristic and a sound pressure level characteristic in about 300 Hz or less may be enhanced.

According to an example embodiment of the present disclosure, a vibration apparatus where a sound characteristic and a sound pressure level characteristic of a super-low-pitched sound band (or an ultra-low-pitched sound band) are enhanced based on a composite vibration (or combined vibration) of a plurality of vibration members and an apparatus including the vibration apparatus may be provided.

A vibration apparatus according to one or more example embodiments of the present disclosure may be applied to a vibration apparatus disposed at (or provided in or at) an apparatus. The apparatus according to one or more example embodiments of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game apparatuses, notebook computers, monitors, cameras, camcorders, home appliances, and so on. Addition, the vibration apparatus according to one or more example embodiments of the present disclosure may be applied to organic light emitting lighting apparatuses or inorganic light emitting lighting apparatuses. When the vibration apparatus according to one or more example embodiments of the present disclosure is applied to lighting apparatuses, the lighting apparatus may act as lighting and a speaker. Addition, when the vibration apparatus according to one or more example embodiments of the present disclosure is applied to a mobile device or the like, the vibration apparatus may act as one or more of a speaker, a receiver, and a haptic apparatus, but embodiments of the present disclosure are not limited thereto.

In one or more aspects, the term "passive" for a passive vibration member and the term "active" for an active vibration member are used merely for convenience to distinguish the passive vibration member and the active vibration member from each other. In one or more aspects, the term "passive" does not require a passive vibration member to be (or to include) a passive element. In one or more aspects, the term "active" does not require an active vibration member to be (or to include) an active element.

Apparatuses and features according to one or more example embodiments of the present disclosure are described below.

An apparatus according to one or more example embodiments of the present disclosure may comprise a passive vibration member, a supporting member overlapping the passive vibration member, and a vibration apparatus between the passive vibration member and the supporting member and configured to include first and second active vibration members connected to each other and intersecting with each other. The first active vibration member may be connected to a first member of one of the passive vibration member and the supporting member, and the second active vibration member may be connected to a second member of the other of the passive vibration member and the supporting member.

According to one or more example embodiments of the present disclosure, the vibration apparatus may comprise an adhesive member between the first active vibration member and the second active vibration member, a first elastic member between the first active vibration member and the first member, and a second elastic member between the second active vibration member and the second member.

According to one or more example embodiments of the present disclosure, the vibration apparatus may further comprise a mass member between the adhesive member and the second active vibration member.

According to one or more example embodiments of the present disclosure, the second active vibration member may comprise an active vibration member (e.g., a 2-1$^{st}$ active vibration member) and another active vibration member (e.g., a 2-2$^{nd}$ active vibration member) each connected to the first active vibration member by the adhesive member and each connected to the second member by the second elastic member, and the active vibration member (e.g., the 2-1$^{st}$ active vibration member) and the another active vibration member (e.g., the 2-2$^{nd}$ active vibration member) may be disposed along a direction intersecting with the first active vibration member and are spaced apart from each other over the first active vibration member.

According to one or more example embodiments of the present disclosure, the first active vibration member may comprise a first vibration device, the active vibration member (e.g., the 2-1$^{st}$ active vibration member) may comprise a vibration device (e.g., a 2-1$^{st}$ vibration device). The another active vibration member (e.g., the 2-2$^{nd}$ active vibration member) may comprise another vibration device (e.g., a 2-2$^{nd}$ vibration device). Each of the vibration device (e.g., the 2-1$^{st}$ vibration device) and the another vibration device (e.g., the 2-2$^{nd}$ vibration device) may have a length which is equal to or different from a length of the first vibration device.

According to one or more example embodiments of the present disclosure, the adhesive member may be disposed between a first periphery portion of the vibration device (e.g., the 2-1$^{st}$ vibration device) and the first vibration device and between a first periphery portion of the another vibration device (e.g., the 2-2$^{nd}$ vibration device) and the first vibration device.

According to one or more example embodiments of the present disclosure, the first elastic member may comprise an elastic member (e.g., a 1-1$^{st}$ elastic member) between a first periphery portion of the first vibration device and the first member and another elastic member (e.g., a 1-2$^{nd}$ elastic member) between a second periphery portion of the first vibration device and the first member, and the second elastic member may comprise an additional elastic member (e.g., a 2-1$^{st}$ elastic member) between a second periphery portion of the vibration device (e.g., the 2-1$^{st}$ vibration device) and the second member and another additional elastic member (e.g., a 2-2$^{nd}$ elastic member) between a second periphery portion of the another vibration device (e.g., the 2-2$^{nd}$ vibration device) and the second member.

According to one or more example embodiments of the present disclosure, the vibration apparatus may further comprise a mass member between the adhesive member and the second active vibration member, and the mass member may comprise a first mass member (e.g., a 1-1$^{st}$ mass member) between the adhesive member and a first periphery portion of the vibration device (e.g., the 2-1$^{st}$ vibration device), and a second mass member (e.g., a 1-2$^{nd}$ mass member) between the adhesive member and a first periphery portion of the another vibration device (e.g., the 2-2$^{nd}$ vibration device).

According to one or more example embodiments of the present disclosure, each of the first mass member (e.g., the 1-1$^{st}$ mass member) and the second mass member (e.g., the 1-2$^{nd}$ mass member) may comprise an elastic material having a strength which is less than a bending strength of each of the first active vibration member and the second active vibration member.

According to one or more example embodiments of the present disclosure, a driving signal for being applied to the first active vibration member may have a phase same as or opposite to a phase of a driving signal for being applied to the second active vibration member.

An apparatus according to one or more example embodiments of the present disclosure may comprise a passive vibration member, a supporting member overlapping the passive vibration member, and a plurality of vibration apparatuses disposed between the passive vibration member and the supporting member. Each of the plurality of vibration apparatuses may comprise a plurality of active vibration members disposed to intersect with one another at an intersection portion, and a plurality of adhesive members each disposed between two adjacent active vibration members of the plurality of active vibration members at the intersection portion. The plurality of active vibration members may be divided into a first group and a second group each including one or more active vibration members, and the one or more active vibration members in the first group may be connected to the supporting member, and the one or more active vibration members in the second group may be connected to the passive vibration member.

According to one or more example embodiments of the present disclosure, the number of active vibration members in the first group may be equal to or different from the number of active vibration members in the second group.

According to one or more example embodiments of the present disclosure, the plurality of vibration apparatuses may be divided into a first apparatus group and a second apparatus group each including one or more vibration apparatuses, and the number of vibration apparatuses in the first apparatus group may be equal to or different from the number of vibration apparatuses in the second apparatus group.

According to one or more example embodiments of the present disclosure, a driving signal for being applied to the one or more vibration apparatuses in the first apparatus group may be same as or different from a driving signal for being applied to the one or more vibration apparatuses in the second apparatus group.

According to one or more example embodiments of the present disclosure, in the one or more vibration apparatuses in the first apparatus group, a driving signal for being applied to the one or more active vibration members in the first apparatus group may have the same phase as a phase of a driving signal for being applied to the one or more active vibration members in the second apparatus group. In the one or more vibration apparatuses in the second apparatus group, a driving signal for being applied to the one or more active vibration members in the first group may have a phase opposite to a phase of a driving signal for being applied to the one or more active vibration members included in the second group.

According to one or more example embodiments of the present disclosure, the passive vibration member may comprise a first region and a second region, the one or more vibration apparatuses in the first apparatus group are disposed at the first region of the passive vibration member, and the one or more vibration apparatuses in the second apparatus group may be disposed at the second region of the passive vibration member.

According to one or more example embodiments of the present disclosure, the one or more active vibration members in the first group may comprise one or more vibration devices connected to the supporting member, and the one or more active vibration members in the second group may comprise at least a pair of vibration devices which intersect with the one or more vibration devices and are spaced apart from each other at the intersection portion.

According to one or more example embodiments of the present disclosure, a driving signal for being applied to the one or more vibration devices may have a phase same as or opposite to a phase of a driving signal for being applied to the pair of vibration devices.

According to one or more example embodiments of the present disclosure, each of the pair of vibration devices may comprise a first periphery portion disposed at the intersection portion and a second periphery portion connected to the passive vibration member. Each of the plurality of vibration apparatuses may comprise at least a pair of first elastic members connected between the supporting member and each of first and second periphery portions of the one or more vibration devices, and at least a pair of second elastic members connected between the passive vibration member and a second periphery portion of each of the pair of vibration devices.

According to one or more example embodiments of the present disclosure, each of the plurality of vibration apparatuses may further comprise a mass member disposed at one or more of an intersection portion between the first group and the second group, a rear center portion of an active vibration member disposed at a lowermost layer of the first group, and a front center portion of an active vibration member disposed at an uppermost layer of the second group.

According to one or more example embodiments of the present disclosure, an electronic device may comprise an apparatus. The apparatus may be configured to act as one or more of a speaker, a receiver and a haptic apparatus in the electronic device. The apparatus may comprise a passive vibration member, a supporting member overlapping the passive vibration member, and a vibration apparatus between the passive vibration member and the supporting member and configured to include first and second active vibration members connected to each other and intersecting with each other. The first active vibration member may be connected to a first member of one of the passive vibration member and the supporting member, and the second active vibration member may be connected to a second member of the other of the passive vibration member and the supporting member.

It will be apparent to those skilled in the art that various modifications and variations can be made in the present disclosure without departing from the technical idea or scope of the present disclosure. Thus, it is intended that the present disclosure covers the modifications and variations of this disclosure provided they come within the scope of the appended claims and their equivalents.

What is claimed is:

1. An apparatus, comprising:
a passive vibration member;
a supporting member overlapping the passive vibration member; and
a vibration apparatus between the passive vibration member and the supporting member and configured to include first and second active vibration members connected to each other and intersecting with each other,
wherein the first active vibration member is connected to a first member of one of the passive vibration member and the supporting member,
wherein the second active vibration member is connected to a second member of the other of the passive vibration member and the supporting member, and
wherein the vibration apparatus comprises:
an adhesive member between the first active vibration member and the second active vibration member;
a first elastic member between the first active vibration member and the first member; and
a second elastic member between the second active vibration member and the second member.

2. The apparatus of claim 1, wherein the vibration apparatus further comprises a mass member between the adhesive member and the second active vibration member.

3. The apparatus of claim 1, wherein the second active vibration member comprises an active vibration member and another active vibration member each connected to the first active vibration member by the adhesive member and each connected to the second member by the second elastic member, and
wherein the active vibration member and the another active vibration member are disposed along a direction intersecting with the first active vibration member and are spaced apart from each other over the first active vibration member.

4. The apparatus of claim 3, wherein:
the first active vibration member comprises a first vibration device;
the active vibration member comprises a vibration device;
the another active vibration member comprises another vibration device; and
each of the vibration device and the another vibration device has a length which is equal to a length of the first vibration device.

5. The apparatus of claim 4, wherein the adhesive member is disposed between a first periphery portion of the vibration device and the first vibration device and between a first periphery portion of the another vibration device and the first vibration device.

6. The apparatus of claim 5, wherein:
the vibration apparatus further comprises a mass member between the adhesive member and the second active vibration member; and
the mass member comprises:
a first mass member between the adhesive member and a first periphery portion of the vibration device; and
a second mass member between the adhesive member and a first periphery portion of the another vibration device.

7. The apparatus of claim 6, wherein each of the first mass member and the second mass member comprises an elastic material having a strength which is less than a bending strength of each of the first active vibration member and the second active vibration member.

8. The apparatus of claim 4, wherein:
the first elastic member comprises an elastic member between a first periphery portion of the first vibration device and the first member and another elastic member between a second periphery portion of the first vibration device and the first member; and
the second elastic member comprises an additional elastic member between a second periphery portion of the vibration device and the second member and another additional elastic member between a second periphery portion of the another vibration device and the second member.

9. The apparatus of claim 1, wherein a driving signal for being applied to the first active vibration member has a phase same as a phase of a driving signal for being applied to the second active vibration member.

10. An electronic device comprising the apparatus of claim 1, wherein the apparatus is configured to act as one or more of a speaker, a receiver and a haptic apparatus in the electronic device.

11. An apparatus, comprising:
a passive vibration member;
a supporting member overlapping the passive vibration member; and
a plurality of vibration apparatuses disposed between the passive vibration member and the supporting member, wherein each of the plurality of vibration apparatuses comprises:
a plurality of active vibration members disposed to intersect with one another at an intersection portion; and
a plurality of adhesive members each disposed between two adjacent active vibration members of the plurality of active vibration members at the intersection portion,
wherein the plurality of active vibration members are divided into a first group and a second group, each of the first and second groups including one or more active vibration members, and
wherein the one or more active vibration members in the first group are connected to the supporting member, and the one or more active vibration members in the second group are connected to the passive vibration member.

12. The apparatus of claim 11, wherein the number of active vibration members in the first group is different from the number of active vibration members in the second group.

13. The apparatus of claim 11, wherein the plurality of vibration apparatuses are divided into a first apparatus group and a second apparatus group, each of the first and second apparatus groups including one or more vibration apparatuses, and
wherein the number of vibration apparatuses in the first apparatus group is different from the number of vibration apparatuses in the second apparatus group.

14. The apparatus of claim 13, wherein a driving signal for being applied to the one or more vibration apparatuses in the first apparatus group is same as a driving signal for being applied to the one or more vibration apparatuses in the second apparatus group.

15. The apparatus of claim 13, wherein:
in the one or more vibration apparatuses in the first apparatus group, a driving signal for being applied to the one or more active vibration members in the first group has a same phase as a phase of a driving signal for being applied to the one or more active vibration members in the second group; and
in the one or more vibration apparatuses in the second apparatus group, a driving signal for being applied to the one or more active vibration members in the first group has a phase opposite to a phase of a driving signal for being applied to the one or more active vibration members in the second group.

16. The apparatus of claim 13, wherein:
the passive vibration member comprises a first region and a second region,
the one or more vibration apparatuses in the first apparatus group are disposed at the first region of the passive vibration member; and
the one or more vibration apparatuses in the second apparatus group are disposed at the second region of the passive vibration member.

17. The apparatus of claim 11, wherein:
the one or more active vibration members in the first group comprise one or more vibration devices connected to the supporting member; and
the one or more active vibration members in the second group comprise at least a pair of vibration devices which intersect with the one or more vibration devices and are spaced apart from each other at the intersection portion.

18. The apparatus of claim 17, wherein a driving signal for being applied to the one or more vibration devices has a phase opposite to a phase of a driving signal for being applied to the pair of vibration devices.

19. The apparatus of claim 17, wherein:
each of the pair of vibration devices comprises a first periphery portion disposed at the intersection portion and a second periphery portion connected to the passive vibration member; and
each of the plurality of vibration apparatuses comprises:
at least a pair of first elastic members connected between the supporting member and each of first and second periphery portions of the one or more vibration devices; and
at least a pair of second elastic members connected between the passive vibration member and a second periphery portion of each of the pair of vibration devices.

20. The apparatus of claim 11, wherein each of the plurality of vibration apparatuses further comprises a mass member disposed at one or more of an intersection portion between the first group and the second group, a rear center portion of an active vibration member disposed at a lowermost layer of the first group, and a front center portion of an active vibration member disposed at an uppermost layer of the second group.

* * * * *